(12) United States Patent
Choe et al.

(10) Patent No.: US 9,558,834 B2
(45) Date of Patent: Jan. 31, 2017

(54) NONVOLATILE MEMORY DEVICE AND AN ERASING METHOD THEREOF

(71) Applicant: SAMSUNG ELECTRONICS CO., LTD., Suwon-si, Gyeonggi-Do (KR)

(72) Inventors: Byeong-In Choe, Yongin-si (KR); Mincheol Park, Seoul (KR); Dongseog Eun, Seongnam-si (KR); Eunsuk Cho, Suwon-si (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 0 days.

(21) Appl. No.: 14/887,454

(22) Filed: Oct. 20, 2015

(65) Prior Publication Data

US 2016/0133330 A1  May 12, 2016

(30) Foreign Application Priority Data

Nov. 10, 2014 (KR) .......................... 10-2014-0155560

(51) Int. Cl.
*G11C 16/04* (2006.01)
*G11C 16/14* (2006.01)
*G11C 7/04* (2006.01)
*G11C 16/32* (2006.01)

(52) U.S. Cl.
CPC ................ *G11C 16/14* (2013.01); *G11C 7/04* (2013.01); *G11C 16/32* (2013.01)

(58) Field of Classification Search
CPC . G11C 16/0483; G11C 16/10; G11C 11/5628; G11C 16/3418; G11C 16/3427; G11C 19/00; G11C 29/00; G11C 7/1006; G11C 8/04; G11C 16/0466; G11C 16/16; G11C 16/32; G11C 29/52
USPC .................. 365/185.09, 185.33, 184, 185.29
See application file for complete search history.

(56) References Cited

U.S. PATENT DOCUMENTS

| | | | |
|---|---|---|---|
| 7,679,133 B2 | 3/2010 | Son et al. | |
| 8,553,466 B2 | 10/2013 | Han et al. | |
| 8,559,224 B2 | 10/2013 | Han et al. | |
| 8,559,235 B2 | 10/2013 | Yoon et al. | |
| 8,654,587 B2 | 2/2014 | Yoon et al. | |
| 8,675,410 B2 | 3/2014 | Pyeon et al. | |
| 8,792,282 B2 | 7/2014 | Lee et al. | |
| 2011/0194357 A1 | 8/2011 | Han et al. | |
| 2011/0233648 A1 | 9/2011 | Seol et al. | |
| 2012/0033503 A1* | 2/2012 | Kim | G11C 16/16 365/185.33 |
| 2012/0201080 A1 | 8/2012 | Kang et al. | |
| 2013/0083599 A1 | 4/2013 | Nam et al. | |
| 2013/0182502 A1 | 7/2013 | Cheo et al. | |
| 2014/0151783 A1 | 6/2014 | Park et al. | |

* cited by examiner

*Primary Examiner* — Thong Q Le
(74) *Attorney, Agent, or Firm* — F. Chau & Associates, LLC

(57) ABSTRACT

An erase method of a nonvolatile memory device includes applying an erase voltage to a substrate; sensing a temperature of a memory cell array; setting a delay time based on the temperature of the memory cell array, wherein the delay time starts in response to the erase voltage being applied to the substrate; applying a ground voltage to a ground selection line connected to a ground selection transistor during the delay time; and increasing a voltage of the ground selection line after the delay time.

20 Claims, 19 Drawing Sheets

| SSL | Float |
| WLs | Vwe |
| GSL | Vss→Float |
| Substrate | Vers |

| SSL | Float |
| WLs | Vwe |
| GSL | Vss→Vgsl |
| Substrate | Vers |

FIG. 14

| SSL | Float |
|---|---|
| WLs | Vwe |
| GSL | Vss→Vgsl→Float |
| Substrate | Vers |

FIG. 15

| SSL | Float |
|---|---|
| WLs | Vwe |
| GSL | Vss→Vgsl1→Vgsl2→Vgsl3 |
| Substrate | Vers |

NONVOLATILE MEMORY DEVICE AND AN ERASING METHOD THEREOF

CROSS-REFERENCE TO RELATED APPLICATION

This application claims priority under 35 U.S.C. §119 to Korean Patent Application No. 10-2014-0155560 filed Nov. 10, 2014, in the Korean Intellectual Property Office, the disclosure of which is incorporated by reference herein in its entirety.

TECHNICAL FIELD

Exemplary embodiments of the inventive concept relate to a nonvolatile memory device and an erasing method thereof.

DISCUSSION OF THE RELATED ART

Semiconductor memory devices may be classified as volatile semiconductor memory devices or nonvolatile semiconductor memory devices. Nonvolatile semiconductor memory devices may retain data stored therein even when not powered. Data stored a nonvolatile semiconductor memory device may be permanent or reprogrammable. Nonvolatile semiconductor memory devices may be used for user data storage and program and microcode storage in a wide variety of applications in the computer, avionics, telecommunications, and consumer electronics industries.

A semiconductor memory device having a three-dimensional array structure has been developed to increase the degree of integration of the semiconductor memory device.

SUMMARY

Exemplary embodiments of the inventive concept provide a nonvolatile memory device and an erase method capable of preventing an erase fail at an erase operation.

An exemplary embodiment of the inventive concept provides an erase method of a nonvolatile memory device which includes a memory cell array having a plurality of memory cells stacked in a direction substantially perpendicular to a substrate and a ground selection transistor connected to the plurality of memory cells. The erase method may include applying an erase voltage to the substrate; sensing a temperature of the memory cell array; setting a delay time based on the temperature of the memory cell array, wherein the delay time starts in response to the erase voltage being applied to the substrate; applying a ground voltage to a ground selection line connected to the ground selection transistor during the delay time; and increasing a voltage of the ground selection line after the delay time.

In the setting of the delay time, the delay time may be increased as the temperature of the memory cell array increases.

In the setting of the delay time, the delay time may be set so that an erase voltage increment when the memory cell array has a first temperature is substantially the same as an erase voltage increment when the memory cell array has a second temperature lower than the first temperature.

In the setting of the delay time, the delay time may be set so that a threshold voltage variation of the ground selection transistor when the memory cell array has a first temperature is substantially the same as a threshold voltage variation of the ground selection transistor when the memory cell array has a second temperature lower than the first temperature.

In the increasing of the voltage of the ground selection line, the ground selection line may be floated after the delay time.

The increasing of the voltage of the ground selection line may include applying a ground selection line voltage to the ground selection line after the delay time.

A voltage of the substrate may increase along a first rising slope from a time when the erase voltage is applied to a maintaining time and the substrate may maintain the erase voltage after the maintaining time. A voltage of the ground selection line may increase along a second rising slope different from the first rising slope from an end of the delay time to the maintaining time and the ground selection line may maintain the ground selection line voltage after the maintaining time.

The second rising slope may be greater than the first rising slope.

A voltage difference between a voltage of the ground selection line and a voltage of the substrate at the end of the delay time may be greater than a voltage difference between a voltage of the ground selection line and a voltage of the substrate at the maintaining time.

The increasing of the voltage of the ground selection line may further include floating the ground selection line after the maintaining time.

The applying of the ground selection line voltage may include applying a first ground selection line voltage to the ground selection line during a first period after the delay time; and applying a second ground selection line voltage to the ground selection line during a second period following the first period.

A voltage of the ground selection line may have a third rising slope during the first period and may have a constant level during the second period.

The applying of the ground selection line voltage may include applying a third ground selection line voltage to the ground selection line during a third period following the second period.

A voltage of the ground selection line may have a fifth rising slope different from the third rising slope.

An exemplary embodiment of the inventive concept provides an erase method of a nonvolatile memory device which includes a memory cell array having a plurality of memory cells stacked in a direction substantially perpendicular to a substrate and a ground selection transistor connected to the plurality of memory cells. The erase method may include applying an erase voltage to the substrate so that a voltage of the substrate has a first rising slope; applying a ground voltage to a ground selection line connected with the ground selection transistor, wherein the ground voltage is applied to the ground selection line in response to the application of the erase voltage; and applying a ground selection line voltage to the ground selection line so that a voltage of the ground selection line has a second rising slope greater than the first rising slope.

The ground selection line voltage may be different from the erase voltage.

A voltage of the substrate may increase along the first rising slope from when the erase voltage is applied to a maintaining time and the substrate may maintain the erase voltage after the maintaining time. A voltage of the ground selection line may increase along the second rising slope different from the first rising slope from an end of the delay time to the maintaining time and the ground selection line may maintain the ground selection line voltage after the maintaining time.

A voltage difference between a voltage of the ground selection line and a voltage of the substrate at the end of the delay time may be greater than a voltage difference between a voltage of the ground selection line and a voltage of the substrate at the maintaining time.

An exemplary embodiment of the inventive concept provides a nonvolatile memory device which includes a memory cell array, an address decoder, a read/write circuit, a voltage generator, a temperature sensor, and a control logic. The memory cell array may include a plurality of memory cells stacked in a direction substantially perpendicular to a substrate and a ground selection transistor connected to the plurality of memory cells. The address decoder may be connected with the plurality of memory cells via word lines and with the ground selection transistor via a ground selection line. The read/write circuit may be connected with the memory cell array via bit lines. The voltage generator may generate an erase voltage to be applied to the substrate and a ground voltage to be applied to the ground selection line during a delay time, at an erase operation. The temperature sensor may sense a temperature of the memory cell array. The control logic may set the delay time according to the sensed temperature of the memory cell array and may control a voltage of the ground selection line to rise after the delay time.

The control logic may control the delay time to increase as the sensed temperature of the memory cell array increases.

An exemplary embodiment of the inventive concept provides an erase method of a nonvolatile memory device including: applying an erase voltage to a substrate of the nonvolatile memory device at a first time point; applying a ground voltage to a ground selection line of the nonvolatile memory device at the first time point, wherein the ground selection line is connected to a ground selection transistor of the nonvolatile memory device; and increasing a voltage of the ground selection line from a second time point to a third time point, wherein the second time point is separated from the first time point by a delay time.

The delay time may be based on a temperature of a memory cell array of the nonvolatile memory device.

The erase voltage may increase from the first time point to the third time point and the voltage of the ground selection line may increase from the second time point to the third time point, and the voltage of the ground selection line may increase faster than the erase voltage.

The nonvolatile memory device may include a plurality of memory cells stacked on top of each other on the substrate.

The ground selection transistor may be disposed between the substrate and a bottommost memory cell of a string of the stacked memory cells.

BRIEF DESCRIPTION OF THE DRAWINGS

The above and other features of the inventive concept will become apparent by describing in detail exemplary embodiments thereof with reference to the following figures, wherein:

FIG. 14 is a table showing a voltage condition at an erase operation of a nonvolatile memory device for a voltage waveform of FIG. 12, according to an exemplary embodiment of the inventive concept;

FIG. 15 is a table showing a voltage condition at an erase operation of the nonvolatile memory device shown in FIG. 10, according to an exemplary embodiment of the inventive concept;

DETAILED DESCRIPTION OF THE EMBODIMENTS

Figure 1:
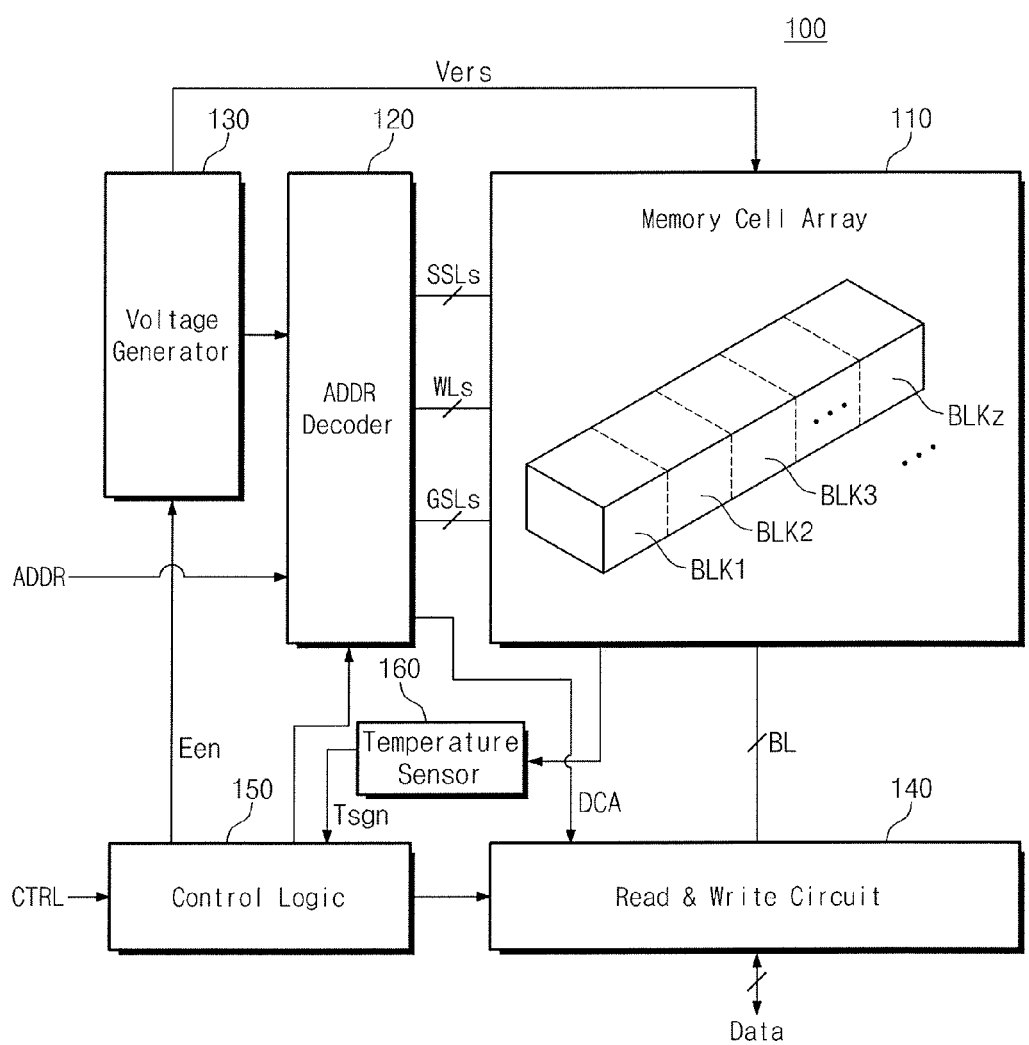
FIG. 1 is a block diagram illustrating a nonvolatile memory device according to an exemplary embodiment of the inventive concept.

Exemplary embodiments of the inventive concept will be described in detail below with reference to the accompanying drawings. The inventive concept, however, may be embodied in various different forms, and should not be construed as being limited only to the illustrated embodiments. Unless otherwise noted, like reference numerals denote like elements throughout the attached drawings and written description, and thus descriptions may not be repeated. In the drawings, the sizes and relative sizes of layers and regions may be exaggerated for clarity.

As used herein, the singular forms "a", "an" and "the" are intended to include the plural forms as well, unless the context clearly indicates otherwise.

It will be understood that when an element or layer is referred to as being "on", "connected to", "coupled to", or "adjacent to" another element or layer, it can be directly on, connected, coupled, or adjacent to the other element or layer, or intervening elements or layers may be present.

FIG. 1 is a block diagram illustrating a nonvolatile memory device 100 according to an exemplary embodiment of the inventive concept. Referring to FIG. 1, the nonvolatile memory device 100 includes a memory cell array 110, an address decoder 120, a voltage generator 130, a read/write circuit 140, a control logic 150, and a temperature sensor 160.

The memory cell array 110 is connected to the address decoder 120 via string selection lines SSL, word lines WL, and ground selection lines GSL and to the read/write circuit 140 via bit lines BL. The memory cell array 110 includes a plurality of memory blocks BLK1 to BLKz (z being an integer of 2 or more), each of which includes a plurality of memory cells and a plurality of selection transistors. The memory cells may be connected with the word lines WL, and the selection transistors may be connected with the string selection lines SSL or the ground selection lines GSL. The memory cells of each memory block may form a three-dimensional structure that is stacked in a direction perpendicular to a substrate. For example, the substrate may be extended horizontally and the memory cells may be stacked vertically.

The address decoder 120 is connected to the memory cell array 110 via the string selection lines SSL, the word lines WL, and the ground selection lines GSL. The address decoder 120 operates in response to a control of the control logic 150. The address decoder 120 receives an address ADDR from an external device.

The address decoder 120 decodes a row address of the input address ADDR. The address decoder 120 selects the word lines WL, the string selection lines SSL, and the ground selection lines GSL using the decoded row address. The address decoder 120 receives various voltages from the voltage generator 130 and transfers the input voltages to the string selection lines SSL, the word lines WL, and the ground selection lines GSL.

The address decoder 120 decodes a column address of the input address ADDR. The decoded column address DCA may be transferred to the read/write circuit 140. In an exemplary embodiment of the inventive concept, the address decoder 120 may include: a row decoder, a column decoder, and an address buffer.

The voltage generator 130 operates according to a control of the control logic 150. The voltage generator 130 generates various voltages used to operate the nonvolatile memory device 100. For example, the voltage generator 130 may generate an erase voltage Vers, which is to be provided to the substrate of the memory cell array 110, in response to an erase enable signal Een. The voltage generator 130 drives the ground selection lines GSL, the word lines WL, and the string selection lines SSL via the address decoder 120 in response to the erase enable signal Een. At an erase operation, the voltage generator 130 may generate a ground voltage to be applied to a ground selection line GSL during a delay time.

The read/write circuit 140 is connected to the memory cell array 110 via the bit lines BL and exchanges data Data with an external device. The read/write circuit 140 operates according to a control of the control logic 150. The read/write circuit 140 is configured to receive the decoded column address DCA from the address decoder 120. The read/write circuit 140 selects the bit lines BL depending on the decoded column address DCA.

In an exemplary embodiment of the inventive concept, the read/write circuit 140 may receive data Data from an external device to write the received data Data at the memory cell array 110. The read/write circuit 140 reads data from the memory cell array 110 to output the read data Data to an external device. The read/write circuit 140 reads data from a first area of the memory cell array 110 and then stores the read data in a second area of the memory cell array 110. For example, the read/write circuit 140 is configured to perform a copy-back operation.

In an exemplary embodiment of the inventive concept, the read/write circuit 140 may include: a page buffer (or a page register), a column selection circuit, and a data buffer. In an exemplary embodiment of the inventive concept, the read/write circuit 140 may include: a sense amplifier, a write driver, a column selection circuit, and a data buffer.

The control logic 150 is connected to the address decoder 120, the voltage generator 130 and the read/write circuit 140. The control logic 150 controls an overall operation of the nonvolatile memory device 100. The control logic 150 operates in response to a control signal CTRL that an external device provides. At an erase operation, the control logic 150 provides the erase enable signal Een to the voltage generator 130.

The temperature sensor 160 measures a temperature of the memory cell array 110. The temperature sensor 160 provides the control logic 150 with a temperature signal Tsgn having information on the measured temperature of the memory cell array 110. At an erase operation, the control logic 150 sets a delay time when a ground voltage is applied to a ground selection line GSL, based on the temperature signal Tsgn.

Figure 2:
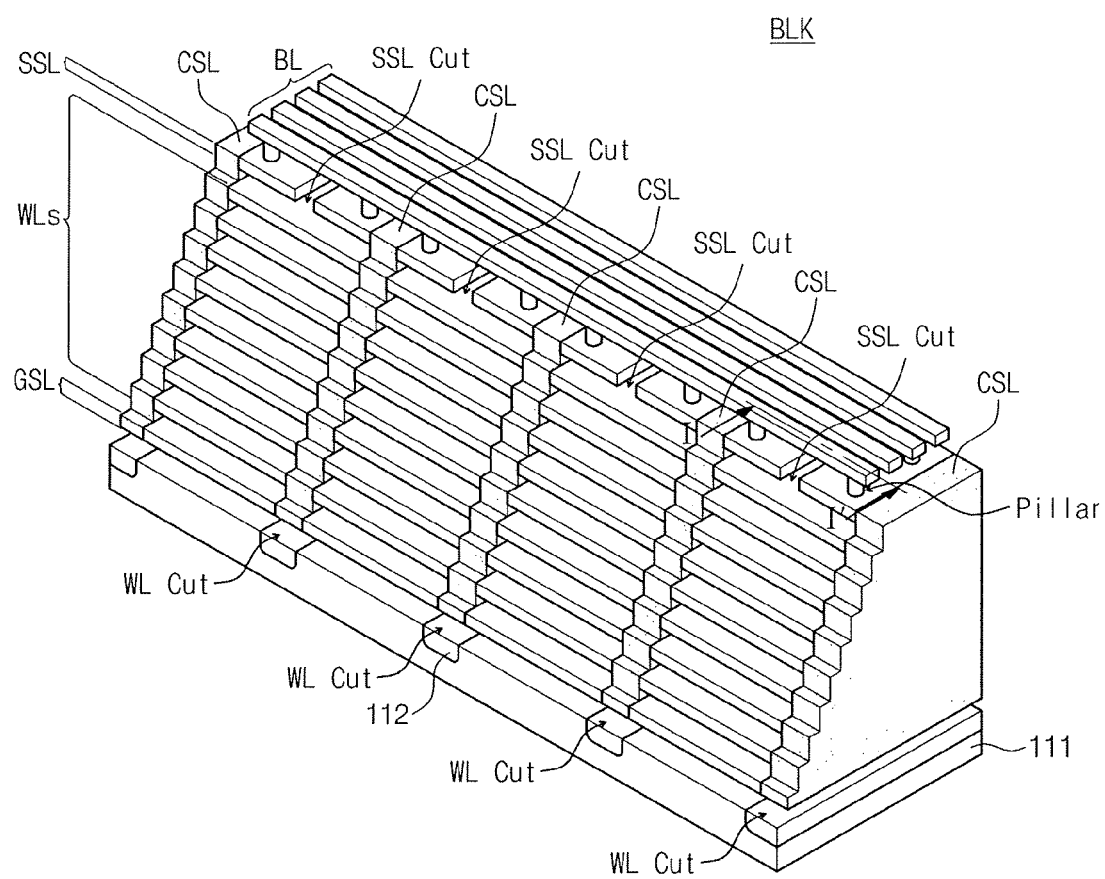
FIG. 2 is a perspective view of a memory block BLK shown in FIG. 1, according to an exemplary embodiment of the inventive concept.
Figure 3:
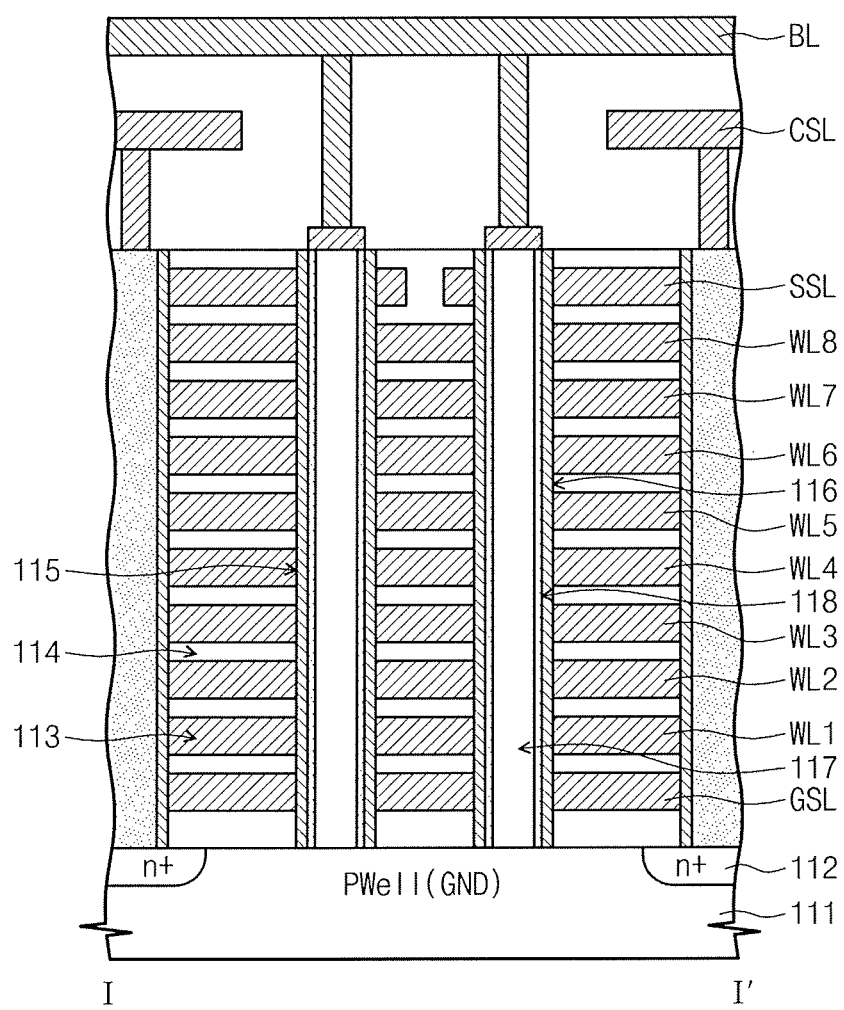
FIG. 3 is a cross-sectional view of a memory block taken along a line I-I' of FIG. 2, according to an exemplary embodiment of the inventive concept.

FIG. 2 is a perspective view of a memory block BLK shown in FIG. 1, according to an exemplary embodiment of the inventive concept. FIG. 3 is a cross-sectional view of a memory block taken along a line I-I' of FIG. 2, according to an exemplary embodiment of the inventive concept.

Referring to FIGS. 2 and 3, a substrate 111 is provided. The substrate 111 may be a well having a first conductivity type. The substrate 111 may be a p-well in which a Group III element, such as boron, is injected, for example. Hereafter, it is assumed that the substrate 111 is a p-well (or, a pocket p-well). However, the substrate 111 is not limited to the p-type.

A plurality of doping regions 112 is provided on the substrate 111. The doping regions 112 extend along a second direction and are spaced apart from each other along a first direction. For example, the doping regions 120 may be an n-type. Hereafter, it is assumed that the doping regions 120 are the n-type. However, the first doping regions 120 are not limited to the n-type.

Four sub blocks are formed on the substrate 111. The sub blocks are formed by stacking and cutting at least one ground selection line GSL, a plurality of word lines WL, and at least one string selection line SSL on the substrate 111 in a plate shape. Here, the at least one string selection line SSL may be cut by string selection line cuts SSL Cut. A common source line CSL may be formed in the form of a wall shape in each word line cut.

In an exemplary embodiment of the inventive concept, the common source lines CSL included in word line cuts WL Cut may be interconnected. A string may be formed by making a pillar connected to a bit line BL penetrate at least one string selection line SSL, the word lines WL, and at least one ground selection line GSL.

In FIG. 2, an exemplary embodiment of the inventive concept illustrates that a structure between word line cuts WL Cut adjacent to each other is a sub block. However, the inventive concept may not be limited thereto. For example, a structure between a word line cut WL Cut and a string selection line cut SSL Cut may be a sub block.

A gate electrode layer 113 and an insulation layer 114 are deposited on the substrate 111 in turn. In an exemplary embodiment of the inventive concept, an information storage layer 115 is formed on lateral surfaces of the gate electrode layer 113 and the insulation layer 114.

The gate electrode layer 113 is connected to a ground selection line GSL, a plurality of word lines WL1 through WL8, and a string selection line SSL. The gate electrode layer 113 includes a metallic conductive material. The gate electrode layer 113 may include a non-metallic conductive material, such as polysilicon.

The information storage layer 115 includes a tunnel insulation layer, a charge storage layer, and a blocking insulation layer. The tunnel insulation layer may act as an insulation layer where charges move due to a tunneling effect. The charge storage layer may include an insulation layer that traps a charge. The charge storage layer may be formed of silicon nitride (SiN) or a metal (e.g., aluminum or hafnium) oxide layer. The blocking insulation layer may act as an insulation layer between the gate electrode layer and the charge storage layer. The blocking insulation layer may be formed of a silicon oxide layer. In an exemplary embodiment of the inventive concept, the tunnel insulation layer, charge storage layer, and blocking insulation layer may constitute an Oxide-Nitride-Oxide (ONO) structure of an insulation layer.

A pillar 116 is formed by vertically patterning the gate electrode layer 113 and the insulation layer 114.

The pillar 116 penetrates the gate electrode layers 113 and the insulation layers 114 and is connected between a bit line BL and the substrate 111. The pillar 116 includes a filling dielectric pattern 117 and a vertical active pattern 118. The filling dielectric pattern 117 contacts the substrate 111. The filling dielectric pattern 117 may include an insulation material such as silicon oxide or air gap. The vertical active pattern 118 may include a channel semiconductor. In an exemplary embodiment of the inventive concept, the vertical active pattern 118 is formed of a p-type silicon layer. However, the inventive concept may not be limited thereto.

For example, the vertical active pattern 118 may be formed of an intrinsic semiconductor.

A cell string may include a plurality of memory cells, a string selection transistor, and a ground selection transistor, which have the same structure. The memory cells, the string selection transistor, and the ground selection transistor may be respectively formed of the filling dielectric pattern 117, the vertical active pattern 118, the information storage layer 115, and the gate electrode layer 113 that are sequentially formed from the inside of the pillar 116.

Common source lines CSL extend on the n+ doping regions 112. The common source lines CSL may be included in word line cuts WL Cut in the form of a wall.

Figure 4:
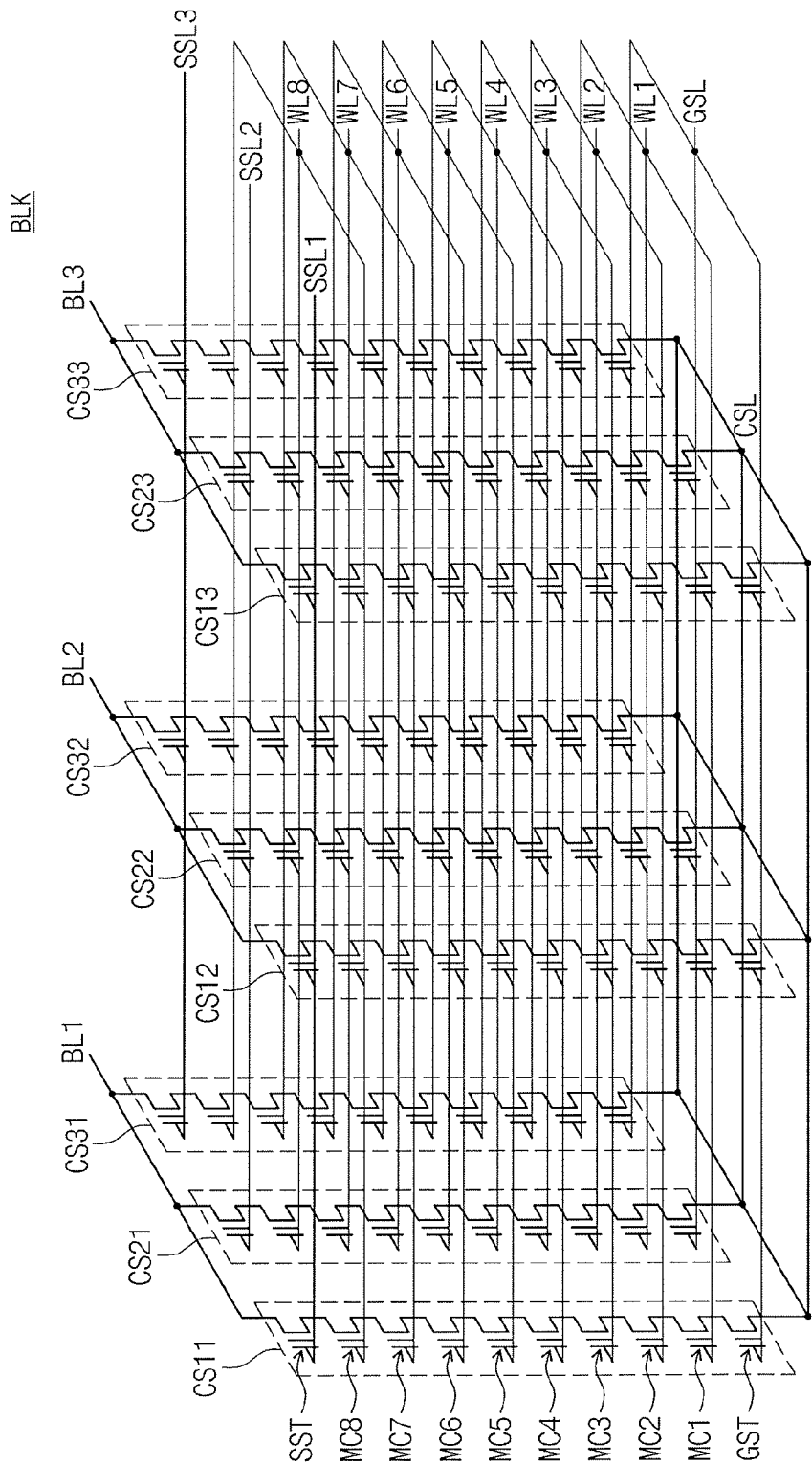
FIG. 4 is a circuit diagram illustrating an equivalent circuit of a memory block shown in FIG. 2, according to an exemplary embodiment of the inventive concept.

FIG. 4 is a circuit diagram illustrating an equivalent circuit of a memory block BLK shown in FIG. 2, according to an exemplary embodiment of the inventive concept. Referring to FIG. 4, cell strings CS11 through CS33 are connected between bit lines BL1 to BL3 and a common source line CSL. Each cell string (e.g., CS11) includes a string selection transistor SST, a plurality of memory cells MC1 to MC8, and a ground selection transistor GST. In FIG. 4, an exemplary embodiment of the inventive concept illustrates a string that includes eight memory cells. However, the inventive concept may not be limited thereto. For example, a string may have more or less than eight memory cells.

The string selection transistors SST are connected to a string selection line SSL. The string selection line SSL is divided into first to third string selection lines SSL1 to SSL3. In FIG. 4, an exemplary embodiment of the inventive concept illustrates that three string selection line SSL1 to SSL3 correspond to a bit line. However, the inventive concept may not be limited thereto. The memory block BLK according to an exemplary embodiment of the inventive concept may be implemented to include at least two string selection lines corresponding to a bit line.

The ground selection transistor GST is connected to a ground selection line GSL. Ground selection lines GSL of cell strings are interconnected. The string selection transistors SST are connected to the bit lines BL1 to BL3 and the ground selection transistors GST are connected to the common source line CSL.

In each string, the memory cells MC1 to MC8 are connected to corresponding word lines WL1 to WL8. A set of memory cells that are connected to a word line and programmed at the same time may be referred to as a page. The memory block BLK is formed of a plurality of pages. In addition, a word line is connected with a plurality of pages. Referring to FIG. 4, a word line (e.g., WL4) with the same height from the common source line CSL is connected in common to three pages.

In addition, each memory cell may store 1-bit data or two or more bits of data. A memory cell storing 1-bit data may be referred to as a single-level cell (SLC) or a single-bit cell. A memory cell storing two or more bits of data may be referred to as a multi-level cell (MLC) or a multi-bit cell. In the case of a 2-bit MLC, two pages of data are stored at a physical page. In other words, six pages of data are stored at memory cells connected to the fourth word line WL4.

The nonvolatile memory device 100 of FIG. 1 may be implemented with a charge trap flash (CTF) memory device. In this case, the initial verify shift (IVS) phenomenon may occur in which a charge trapped in a programmed CTF is redistributed and leaked over time. Reprogramming may be performed to prevent such distribution deterioration.

In FIG. 4, an exemplary embodiment of the inventive concept illustrates that the ground selection line GSL is shared. However, the inventive concept may not be limited thereto. For example, the ground selection line may be divided like the string selection line SSL.

In an exemplary embodiment of the inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" may mean that layers of each level of the array are directly deposited on the layers of each underlying level of the array.

In an exemplary embodiment of the inventive concept, the 3D memory array includes vertical NAND strings that are vertically oriented such that at least one memory cell is located over another memory cell. The at least one memory cell may comprise a charge trap layer. Each vertical NAND string further includes at least one select transistor located over the memory cells, the at least one select transistor may have the same structure as the memory cells and may be formed monolithically together with the memory cells.

The following patent documents, the disclosures of which are incorporated by reference herein in their entireties, describe exemplary configurations of 3D memory arrays: U.S. Pat. Nos. 7,679,133; 8,553,466; 8,654,587; 8,559,235; and US Pat. Pub. No. 2011/0233648. The 3D memory arrays of these patent documents describe 3D memory arrays configured with a plurality of levels and with word lines and/or bit lines shared between these levels.

Figures 5, 6:
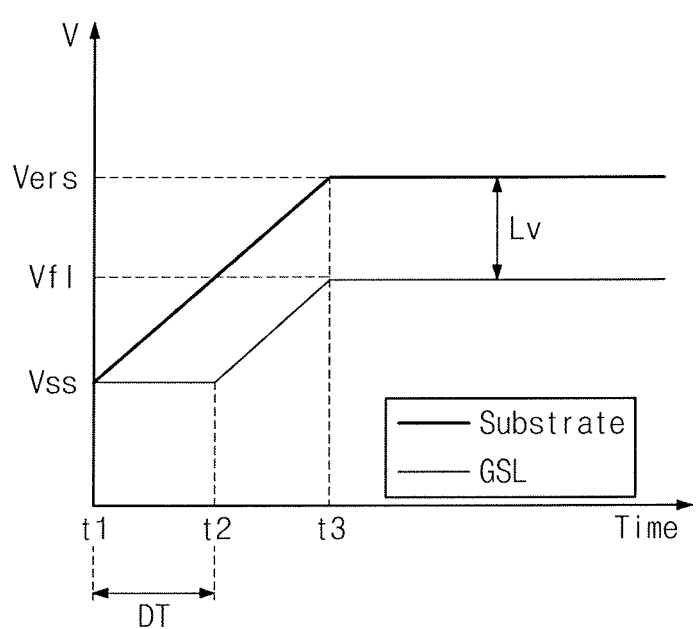
FIG. 5 is a table showing a voltage condition at an erase operation of the nonvolatile memory device shown in FIG. 1, according to an exemplary embodiment of the inventive concept.
FIG. 6 is a diagram showing waveforms of voltages applied to a substrate and a ground selection line depending on a voltage condition of FIG. 5, according to an exemplary embodiment of the inventive concept.

FIG. 5 is a table showing a voltage condition at an erase operation of the nonvolatile memory device 100 shown in FIG. 1, according to an exemplary embodiment of the inventive concept. FIG. 6 is a diagram showing waveforms of voltages applied to a substrate and a ground selection line depending on a voltage condition of FIG. 5, according to an exemplary embodiment of the inventive concept. An erase operation of a memory block BLK will be more fully described with reference to FIGS. 1 through 6.

At an erase operation, an erase voltage Vers is applied to the substrate 111. The substrate 111 has the same conductivity type as the vertical active pattern 118. Thus, the erase voltage Vers applied to the substrate 111 is transferred to the vertical active pattern 118. In an exemplary embodiment of the inventive concept, the erase voltage Vers may be a high voltage. A voltage of the substrate 111 rises from a first point in time t1 to a third point in time t3. The substrate 111 maintains the erase voltage Vers after the third point in time t3. The first point in time t1 is a point in time when the erase voltage Vers is applied to the substrate 111. The third point in time t3 may be referred to as a maintaining point in time.

The string selection lines SSL1 to SSL3 are floated during the erase operation. Thus, when a voltage of the vertical active pattern 118 varies, the string selection lines SSL1 to SSL3 may be subject to coupling from the vertical active pattern 118. For example, when a voltage of the vertical active pattern 118 rises to the erase voltage Vers, voltages of the string selection lines SSL1 to SSL3 may also increase. This may mean that the string selection transistors SST are erase-inhibited.

At the erase operation, a word line erase voltage Vwe is applied to the word lines WL1 through WL8, respectively. In an exemplary embodiment of the inventive concept, the word line erase voltage Vwe may be a low voltage. For example, the word line erase voltage Vwe may be a ground voltage Vss. Voltage differences between the vertical active pattern 118 and the word lines WL1 to WL8 cause the Fowler-Nordheim tunneling in the memory cells MC1 to MC8. In other words, the memory cells MC1 to MC8 are erased.

At the erase operation, the ground voltage Vss is applied to the ground selection line GSL during a delay time DT between the first point in time t1 and a second point in time t2, and the ground selection line GSL is floated after the delay time DT. The coupling with the substrate 111 permits a voltage of the ground selection line GSL to rise from t2 to t3. The ground selection line GSL maintains a floating voltage Vfl after the third point in time t3.

A ground selection transistor GST has the same structure as the memory cells MC1 to MC8. In other words, the ground selection transistor GST includes the filling dielectric pattern 117, the vertical active pattern 118, the information storage layer 115, and the gate electrode layer 113. Thus, the ground selection transistor GST is erased or written as the memory cells MC1 to MC8 are erased or written, thereby causing a threshold voltage variation in the ground selection transistor GST.

If a voltage of the ground selection line GSL increases at the first point in time t1 when the erase voltage Vers is applied to the substrate 111, holes are not smoothly supplied from the substrate 111 to the vertical active pattern 118. In this case, since voltages between the vertical active pattern 118 and the word lines WL1 to WL8 decrease, an erase fail may occur. In other words, to have a successful erase, an erase voltage having a greater level than the erase voltage Vers is required. According to an exemplary embodiment of the inventive concept, since a ground voltage Vss is applied to the ground selection line GSL during the delay time DT, holes may be smoothly supplied from the substrate 111 to the vertical active pattern 118. Since the ground selection line GSL is floated after the delay time DT, the ground selection transistor GST is prevented from being erased.

Figure 7:
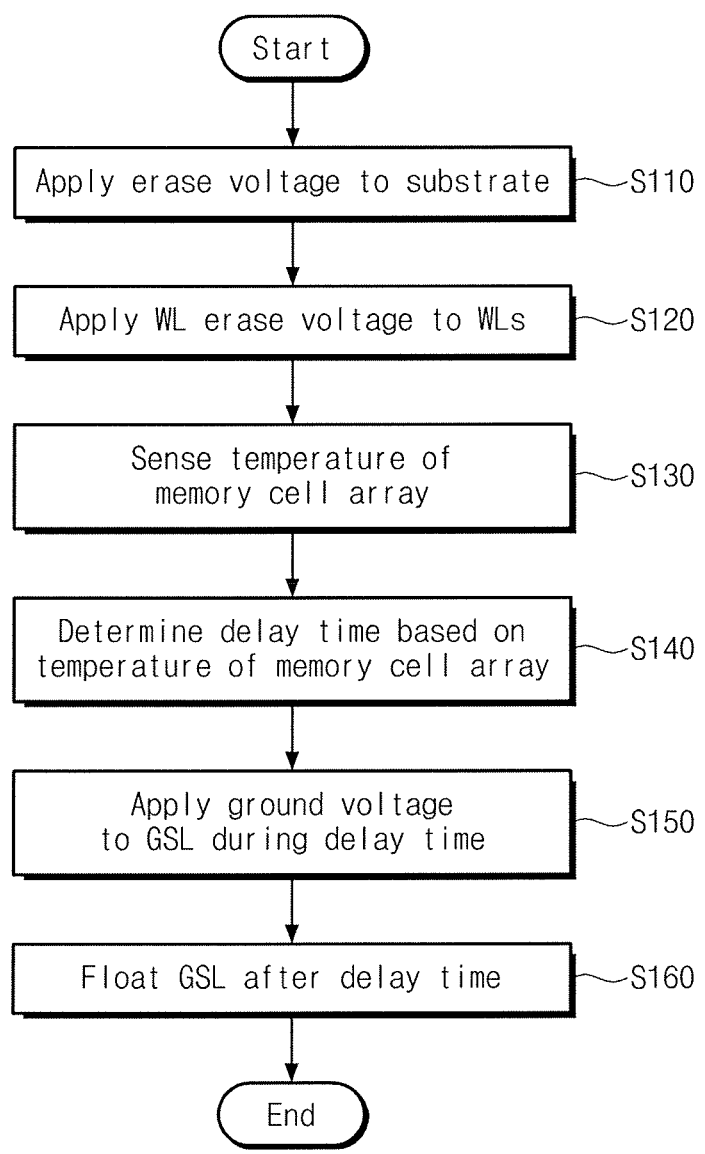
FIG. 7 is a flowchart showing an erase method according to an exemplary embodiment of the inventive concept.

FIG. 7 is a flowchart showing an erase method according to an exemplary embodiment of the inventive concept. Referring to FIGS. 1 to 7, in step S110, an erase voltage Vers is applied to the substrate 111. In step S120, a word line erase voltage Vwe is applied to the word lines WL1 to WL8. In step S130, the temperature sensor 160 measures a temperature of the memory cell array 110. The temperature sensor 160 provides the control logic 150 with a temperature signal Tsgn having information on the measured temperature of the memory cell array 110.

In step S140, the control logic 150 sets a delay time DT based on the temperature signal Tsgn. For example, a temperature of the memory cell array 110 may be a first temperature or a second temperature. Here, the first temperature may be a temperature higher than a predetermined reference temperature, and the second temperature may be lower than the predetermined reference temperature. The delay time DT when the memory cell array 110 has the first temperature may be different from that when the memory cell array 110 has the second temperature. This will be more fully described later.

In step S150, the ground voltage Vss is applied to the ground selection line GSL during the set delay time DT. In step S160, the ground selection line GSL is floated after the set delay time DT. A voltage of the ground selection line GSL increases due to the coupling with a voltage of the substrate 111.

Step S140 will be more fully described with reference to FIGS. 8 and 9.

Figure 8:
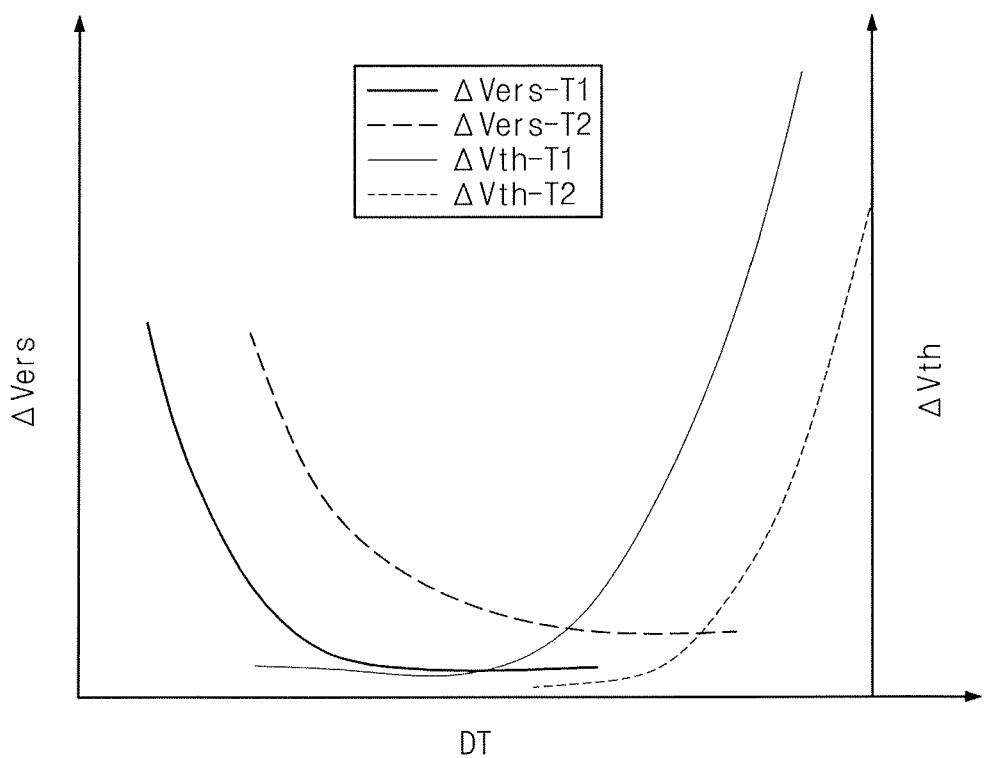
FIG. 8 is a diagram showing variations in an erase voltage and a threshold voltage of a ground selection transistor when compensating for a delay time according to a temperature is not performed.

FIG. 8 is a diagram showing variations in an erase voltage and a threshold voltage of a ground selection transistor when compensating for a delay time according to a temperature is not performed. In FIG. 8, there are illustrated a waveform of an erase voltage increment ΔVers-T1 needed for a delay time DT at a first temperature, a waveform of a threshold voltage increment ΔVth-T1 for the delay time DT at the first temperature, a waveform of an erase voltage increment ΔVers-T2 needed for a delay time DT at a second temperature, and a waveform of a threshold voltage increment ΔVth-T2 for the delay time DT at the second temperature. Here, the erase voltage increment ΔVers may be a voltage that is required in addition to an erase voltage Vers set to perform a normal erase operation with respect to the memory cells MC1 to MC8.

Referring to FIGS. 3 and 5 to 8, as seen from the erase voltage increment (ΔVers-T1) waveform, the erase voltage increment ΔVers-T1 increases as the delay time DT becomes short and decreases as the delay time DT becomes long. If holes are not smoothly supplied from the substrate 111 to the vertical active pattern 118, a voltage having a level greater than that of the erase voltage Vers is required. For this reason, the erase voltage increment ΔVers may increase. If holes are smoothly supplied from the substrate 111 to the vertical active pattern 118, the erase voltage increment ΔVers may decrease.

Referring to the threshold voltage variation (ΔVth-T1) waveform on the ground selection transistor GST according to the delay time DT at the first temperature, the threshold voltage variation ΔVth of the ground selection transistor GST at the first temperature decreases as the delay time DT becomes short and increases as the delay time DT becomes long. If a ground voltage Vss and an erase voltage Vers are respectively applied to the ground selection line GSL and the substrate 111 during the delay time DT, the ground selection transistor GST may be partially erased. A threshold voltage of the partially erased ground selection transistor GST may decrease. A threshold voltage of the ground selection transistor GST continues to decrease due to an iteration of an erase operation, thereby causing an erase fail to occur.

As the delay time DT becomes short, a time in which the ground selection transistor GST is erased is reduced, thereby decreasing the threshold voltage variation ΔVth of the ground selection transistor GST.

As the delay time DT becomes long, a time in which the ground selection transistor GST is erased becomes long, thereby increasing the threshold voltage variation ΔVth of the ground selection transistor GST.

The waveform of the erase voltage increment ΔVers-T2 for the delay time DT at the second temperature is shifted to the right as compared with the waveform of the erase voltage increment ΔVers-T1 for the delay time DT at the first temperature. The same erase voltage increment ΔVers is maintained by setting a delay time DT needed at the first temperature to be shorter than a delay time DT needed at the second temperature. The erase voltage increment ΔVers needed at the second temperature increases as the delay time DT becomes short and decreases as the delay time DT becomes long.

The waveform of the threshold voltage variation ΔVth-T2 of the ground selection transistor GST for the delay time DT at the second temperature is shifted to the right as compared with the waveform of the threshold voltage variation ΔVth-T1 of the ground selection transistor GST for the delay time DT at the first temperature. The same threshold voltage variation ΔVth of the ground selection transistor GST is maintained by setting a delay time DT needed at the first temperature to be shorter than a delay time DT needed at the second temperature. The threshold voltage variation ΔVth of the ground selection transistor GST at the second temperature decreases as the delay time DT becomes short and increases as the delay time DT becomes long.

The nonvolatile memory device 100 according to an exemplary embodiment of the inventive concept compensates for a delay time DT according to a temperature. The nonvolatile memory device 100 adjusts the delay time DT such that a waveform of an erase voltage increment at a first temperature is equal to that at a second temperature. The nonvolatile memory device 100 adjusts the delay time DT such that a waveform of a threshold voltage variation of the ground selection transistor GST at the second temperature is equal to that at the first temperature.

For example, to right shift the waveform of the erase voltage increment ΔVers-T1 needed for the delay time DT at a first temperature and the waveform of the threshold voltage variation ΔVth-T1 of the ground selection transistor GST for the delay time DT at the first temperature, the nonvolatile memory device 100 controls the delay time DT to be longer when the first temperature is sensed than when a second temperature is sensed. For example, to right shift the waveform of an erase voltage increment ΔVers-T2 needed for the delay time DT at the second temperature and the waveform of the threshold voltage variation ΔVth-T2 of the ground selection transistor GST for the delay time DT at the second temperature, the nonvolatile memory device 100 controls the delay time DT such that when the second temperature is sensed the delay time DT is shorter than that when the first temperature is sensed.

The nonvolatile memory device 100 according to an exemplary embodiment of the inventive concept controls a voltage difference Lv between a floating voltage Vfl and an erase voltage Vers according to a temperature. For example, when a delay time DT increases, there is a reduced amount of time for a voltage of the ground selection line GSL to experience coupling with a substrate voltage. Thus, when the delay time DT increases, the voltage difference Lv between the floating voltage Vfl and the erase voltage Vers may increase. In contrast, when the delay time DT decreases, the voltage difference Lv between the floating voltage Vfl and the erase voltage Vers may decrease.

Figure 9:
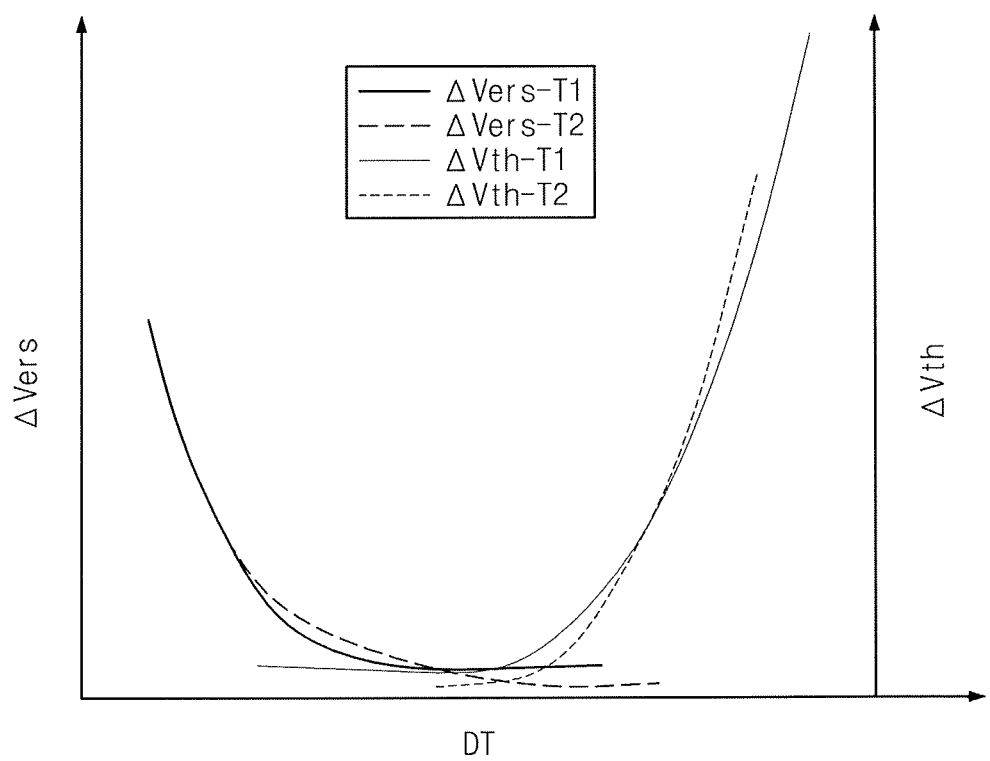
FIG. 9 is a diagram showing waveforms of an erase voltage increment and a threshold voltage variation of a ground selection transistor when compensating for a delay time according to a temperature, according to an exemplary embodiment of the inventive concept.

FIG. 9 is a diagram showing waveforms of an erase voltage increment and a threshold voltage variation of a ground selection transistor when compensating for a delay time according to a temperature, in accordance with an exemplary embodiment of the inventive concept.

Referring to FIG. 9, in the event that a process for compensating for a delay time DT according to a temperature is performed, unlike that shown in FIG. 8, a waveform of an erase voltage increment ΔVers-T1 needed for a delay time DT at a first temperature is essentially identical to a waveform of an erase voltage increment ΔVers-T2 needed for a delay time DT at a second temperature. In addition, in the event that a process for compensating for a delay time DT according to a temperature is performed, unlike that shown in FIG. 8, a waveform of a threshold voltage variation ΔVth-T1 of a ground selection transistor GST for a delay time DT at the first temperature is essentially identical to a waveform of a threshold voltage variation ΔVth-T2 of the ground selection transistor GST for a delay time DT at the second temperature.

The nonvolatile memory device 100 according to an exemplary embodiment of the inventive concept adjusts a delay time DT according to a temperature of the memory cell array 110 to prevent an erase fail from occurring when a threshold voltage variation ΔVth of the ground selection transistor GST changes according to a temperature. In addition, the nonvolatile memory device 100 according to an exemplary embodiment of the inventive concept adjusts the delay time DT according to a temperature of the memory cell array 110 to prevent an erase fail from occurring when an erase voltage increment ΔVers changes according to a temperature.

Figure 10:
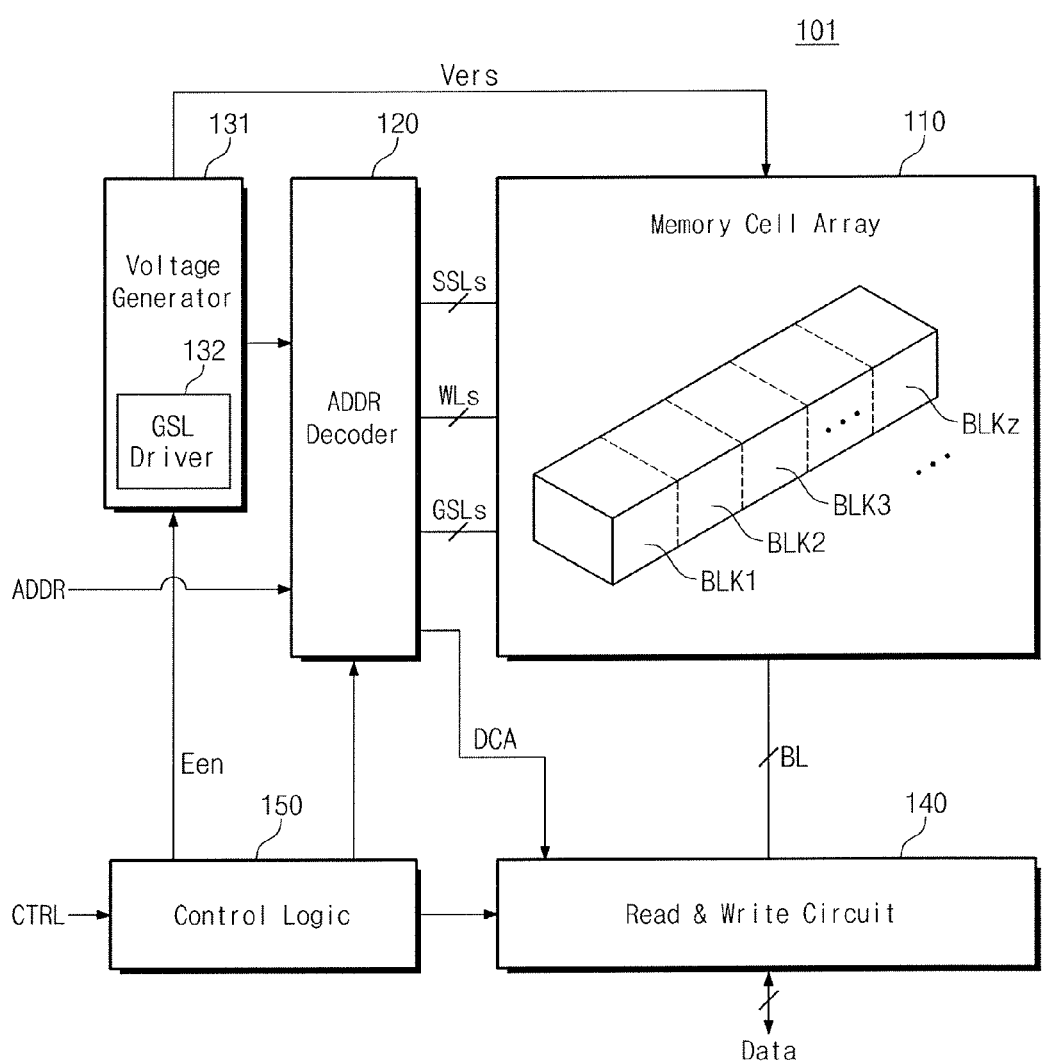
FIG. 10 is a block diagram illustrating a nonvolatile memory device according to an exemplary embodiment of the inventive concept.

FIG. 10 is a block diagram illustrating a nonvolatile memory device according to an exemplary embodiment of the inventive concept. Referring to FIG. 10, a nonvolatile memory device 101 includes a memory cell array 110, an address decoder 120, a voltage generator 131, a read/write circuit 140, and a control logic 150. The components of the nonvolatile memory device 101 other than the voltage generator 131 may be substantially the same as those shown in FIG. 1, and thus, a detailed description thereof is omitted.

The voltage generator 131 operates according to a control of the control logic 150. The voltage generator 131 generates various voltages used to operate the nonvolatile memory device 101. For example, the voltage generator 131 may generate an erase voltage Vers, which is to be provided to the substrate 111 of the memory cell array 110, in response to an erase enable signal Een. The voltage generator 131 drives the ground selection lines GSL, the word lines WL, and the string selection lines SSL via the address decoder 120 in response to the erase enable signal Een.

The voltage generator 131 includes a ground selection line (GSL) driver 132. The GSL driver 132 generates a ground voltage and a ground selection line voltage to be applied to a ground selection line GSL at an erase operation. A level of the ground selection line voltage is different from that of the erase voltage Vers.

The nonvolatile memory device 101 applies the ground selection line voltage to the ground selection line GSL to control a slope along which a voltage of the ground selection line GSL increases and a slope along which a voltage of the substrate 111 of the memory cell array 110 increases. This will be more fully described later.

Figures 11, 12:
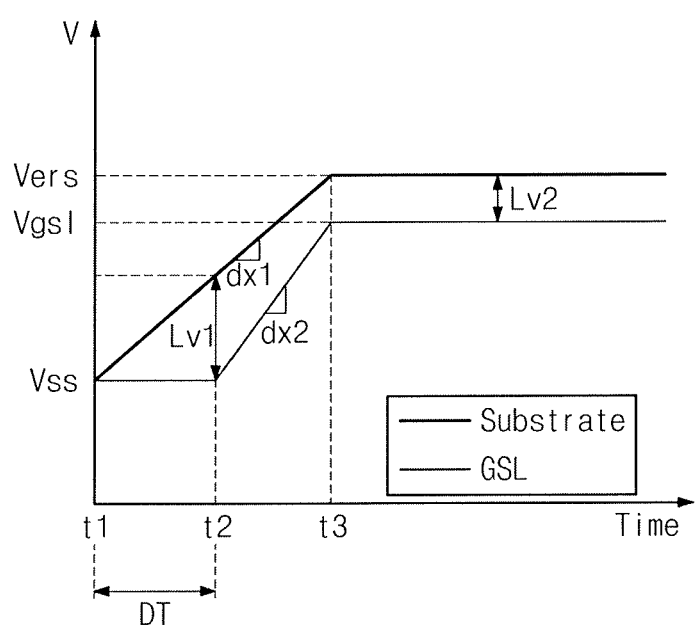
FIG. 11 is a table showing a voltage condition at an erase operation of the nonvolatile memory device shown in FIG. 10, according to an exemplary embodiment of the inventive concept.
FIG. 12 is a diagram showing waveforms of a voltage applied to a ground selection line depending on a voltage condition of FIG. 10, according to an exemplary embodiment of the inventive concept.

FIG. 11 is a table showing a voltage condition at an erase operation of the nonvolatile memory device 101 shown in FIG. 10, according to an exemplary embodiment of the inventive concept. FIG. 12 is a diagram showing waveforms of a voltage applied to a ground selection line depending on a voltage condition of FIG. 10, according to an exemplary embodiment of the inventive concept. An erase operation of a memory block BLK will be more fully described with reference to FIGS. 2 to 4 and 10 to 12.

Voltages applied to the string selection lines SSL1 to SSL3, the word lines WL1 to WL8, and the substrate 111 may be substantially the same as those described with reference to FIGS. 5 and 6. Hereafter, a description may be made with a voltage applied to a ground selection line GSL at the center.

A ground voltage Vss is applied to the ground selection line GSL during a delay time DT between t1 and t2. A ground selection line voltage Vgsl is applied to the ground selection line GSL after the delay time DT. The applied ground selection line voltage Vgsl permits a voltage of the ground selection line GSL to rise from t2 to t3. The ground selection line GSL maintains the ground selection line voltage Vgsl after t3.

The delay time DT may be set to a time that it takes a voltage of the substrate 111 to reach a predetermined level or to a predetermined time after t1. A voltage of the substrate 111 has a first rising slope dx1 from t1 to t3. A voltage of the ground selection line GSL has a second rising slope dx2, which is different from the first rising slope dx1, from t2 to t3. Here, the second rising slope dx2 is greater than the first rising slope dx1. In other words, a voltage of the ground selection line GSL rises faster than that of the substrate 111.

A level of the ground selection line voltage Vgsl is lower than that of the erase voltage Vers. A voltage difference Lv1 (hereinafter referred to as a "second point-in-time voltage difference") between a voltage of the ground selection line GSL and a voltage of the substrate 111 at t2 is greater than a voltage difference Lv2 (hereinafter referred to as a "third point-in-time voltage difference") between a voltage of the ground selection line GSL and a voltage of the substrate 111 at t3.

According to an exemplary embodiment of the inventive concept, the ground voltage Vss is applied to the ground selection line GSL during the delay time DT for holes to be smoothly supplied to the vertical active pattern 118 from the substrate 111, to help prevent an erase fail.

After t3, a voltage level of the ground selection line GSL becomes lower than a voltage level of the substrate 111, thereby causing a ground selection transistor GST to be unintentionally erased. If the ground selection line GSL is floated at t2, the second point-in-time voltage difference Lv1 may be substantially the same as the third point-in-time voltage difference Lv2.

According to an exemplary embodiment of the inventive concept, since a voltage of the ground selection line GSL rises faster than a voltage of the substrate 111, the third point-in-time voltage difference Lv2 may be smaller than the second point-in-time voltage difference Lv1. Thus, after t3, a voltage difference Lv2 between a voltage of the ground selection line GSL and a voltage of the substrate 111 decreases, thereby preventing the ground selection transistor GST from being unintentionally erased at an erase operation. Accordingly, an erase operation may become reliable by minimizing a threshold voltage variation of the ground selection transistor GST.

Figure 13:
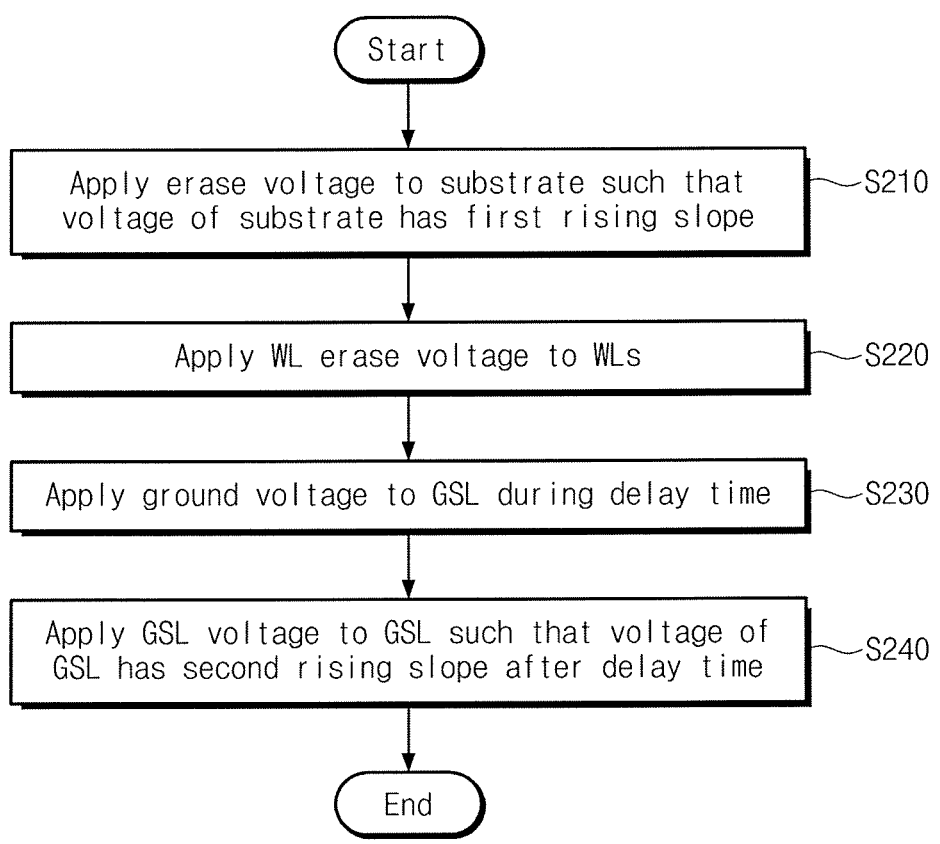
FIG. 13 is a flowchart showing an erase method according to an exemplary embodiment of the inventive concept.

FIG. 13 is a flowchart showing an erase method according to an exemplary embodiment of the inventive concept. Referring to FIGS. 2 to 4 and 10 to 13, in step S210, an erase voltage Vers is applied to the substrate 111. A voltage of the substrate 111 may have a first rising slope dx1 due to the erase voltage Vers. In step S220, a word line erase voltage Vwe is applied to the word lines WL1 to WL8. In step S230, a ground voltage Vss is applied to the ground selection line GSL during a delay time DT. In step S240, a ground selection line voltage Vgsl is applied to the ground selection line GSL after the delay time DT. A voltage of the ground selection line GSL may have a second rising slope dx2 due to the ground selection line voltage Vgsl. The second rising slope dx2 is greater than the first rising slope dx1.

FIG. 14 is a table showing a voltage condition at an erase operation of the nonvolatile memory device 101 for a voltage waveform of FIG. 12, according to an exemplary embodiment of the inventive concept. A voltage waveform shown in FIG. 12 is obtained according to a voltage condition of FIG. 14. An erase operation will be more fully described with reference to FIGS. 2 to 4, 10, 12, and 14.

Voltages applied to the string selection lines SSL1 to SSL3, the word lines WL1 to WL8, and the substrate 111 may be substantially the same as those described with reference to FIGS. 5 and 6. Hereafter, a description may be made with a voltage applied to a ground selection line GSL at the center.

A ground voltage Vss is applied to the ground selection line GSL during the delay time DT between t1 and t2. The ground selection line voltage Vgsl is applied to the ground selection line GSL after the delay time DT. The applied ground selection line voltage Vgsl permits a voltage of the ground selection line GSL to rise from t2 to t3. The ground selection line GSL maintains the ground selection line voltage Vgsl after t3. The ground selection line GSL is floated at t3. Since the substrate 111 maintains the erase voltage Vers after t3, a voltage of the floated ground selection line GSL is not changed by coupling with a substrate voltage.

The delay time DT may be set to a time that it takes for a voltage of the substrate 111 to reach a predetermined level or to a predetermined time after t1.

A voltage of the substrate 111 has the first rising slope dx1 from t1 to t3. A voltage of the ground selection line GSL has the second rising slope dx2, which is different from the first rising slope dx1, from t2 to t3. Here, the second rising slope dx2 is greater than the first rising slope dx1. In other words, a voltage of the ground selection line GSL rises faster than that of the substrate 111.

A level of the ground selection line voltage Vgsl is lower than that of the erase voltage Vers. A voltage difference Lv1 (also referred to as a "second point-in-time voltage difference") between a voltage of the ground selection line GSL and a voltage of the substrate 111 at t2 is greater than a voltage difference Lv2 (also referred to as a "third point-in-time voltage difference") between a voltage of the ground selection line GSL and a voltage of the substrate 111 at t3.

According to an exemplary embodiment of the inventive concept, the ground voltage Vss is applied to the ground selection line GSL during the delay time DT for holes to be smoothly supplied to the vertical active pattern 118 from the substrate 111, to help prevent an erase fail.

According to an exemplary embodiment of the inventive concept, as a voltage of the ground selection line GSL rises faster than a voltage of the substrate 111, the third point-in-time voltage difference Lv2 may be smaller than the second point-in-time voltage difference Lv1. After t3, a voltage difference Lv2 between a voltage of the ground selection line GSL and a voltage of the substrate 111 decreases, thereby preventing the ground selection transistor GST from being erased at an erase operation. Accordingly, an erase operation may become reliable by minimizing a threshold voltage variation of the ground selection transistor GST.

Figure 16:
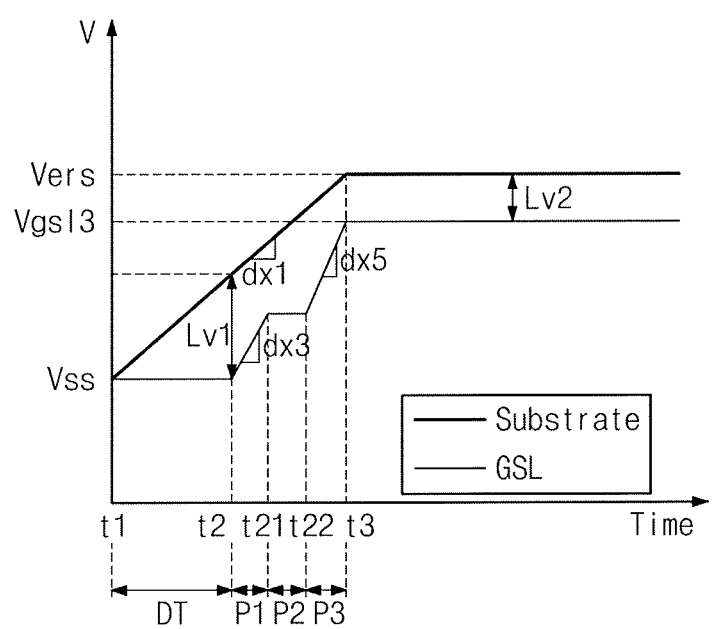
FIG. 16 is a diagram showing waveforms of a voltage applied to a ground selection line depending on a voltage condition of FIG. 15, according to an exemplary embodiment of the inventive concept.

FIG. 15 is a table showing a voltage condition at an erase operation of the nonvolatile memory device 101 shown in FIG. 10, according to an exemplary embodiment of the inventive concept. FIG. 16 is a diagram showing waveforms of a voltage applied to a ground selection line depending on a voltage condition of FIG. 15, according to an exemplary embodiment of the inventive concept. An erase operation of a memory block BLK will be more fully described with reference to FIGS. 2 to 4, 10, 15, and 16.

Voltages applied to the string selection lines SSL1 to SSL3, the word lines WL1 to WL8, and the substrate 111 may be substantially the same as those described with reference to FIGS. 5 and 6. Hereafter, a description may be made with a voltage applied to a ground selection line GSL at the center.

A ground voltage Vss is applied to the ground selection line GSL during a delay time DT between t1 and t2.

After the delay time DT, a plurality of voltages is sequentially applied to the ground selection line GSL. A voltage of the ground selection line GSL may have two or more different rising slopes due to the sequentially applied plurality of voltages. In FIG. 16, it can be seen that a voltage of the ground selection line GSL has a stepwise rising waveform.

At the erase operation, an erase voltage Vers is applied to the substrate 111. A voltage of the substrate 111 has a first rising slope dx1 from t1 to t3. The substrate 111 maintains the erase voltage Vers after t3.

After the delay time DT, a first ground selection line voltage Vgsl1 is applied to the ground selection line GSL during a first period P1 from t2 to a first intermediate point in time t21. A voltage of the ground selection line GSL has a third rising slope dx3 during the first period P1.

A second ground selection line voltage Vgsl2 is applied to the ground selection line GSL during a second period P2 from the first intermediate point in time t21 to a second intermediate point in time t22. A voltage of the ground selection line GSL has little or no slope during the second period P2. In an exemplary embodiment of the inventive concept, the slope during the second period P2 may be "0". In other words, the ground selection line GSL maintains a voltage corresponding to the voltage level at t21 during the second period P2. The second ground selection line voltage Vgsl2 may be a voltage of the ground selection line GSL corresponding to the voltage level at t21. However, the inventive concept may not be limited thereto. For example, the ground selection line voltage Vgsl2 may be greater than the voltage of the ground selection line GSL at t21 and thus the slope during the second period P2 may be greater than "0" and may be different from the third rising slope dx3.

A third ground selection line voltage Vgsl3 is applied to the ground selection line GSL during a third period P3 from the second intermediate point in time t22 to a third point in time t3. The third ground selection line voltage Vgsl3 permits a voltage of the ground selection line GSL to rise during the third period P3. The ground selection line GSL maintains the third ground selection line voltage Vgsl3 after t3. A voltage of the ground selection line GSL has a fifth rising slope dx5 during the third period P3. The fifth rising slope dx5 may be different from the third rising slope dx3 and the slope during the second period.

A level of the third ground selection line voltage Vgsl3 is lower than that of the erase voltage Vers. A voltage difference Lv1 (hereinafter referred to as a "second point-in-time voltage difference") between a voltage of the ground selection line GSL and a voltage of the substrate 111 at t2 is greater than a voltage difference Lv2 (hereinafter referred to as a "third point-in-time voltage difference") between a voltage of the ground selection line GSL and a voltage of the substrate 111 at t3.

According to an exemplary embodiment of the inventive concept, the ground voltage Vss is applied to the ground selection line during the delay time DT for holes to be smoothly supplied to the vertical active pattern 118 from the substrate 111, to help prevent an erase fail.

According to an exemplary embodiment of the inventive concept, as a voltage of the ground selection line GSL rises faster than a voltage of the substrate 111, the third point-in-time voltage difference Lv2 may be smaller than the second point-in-time voltage difference Lv1. After t3, the voltage difference Lv2 between a voltage of the ground selection line GSL and a voltage of the substrate 111 decreases, thereby preventing the ground selection transistor GST from being erased at an erase operation. Accordingly, an erase operation may be reliably performed by minimizing a threshold voltage variation of the ground selection transistor GST.

Figure 17:
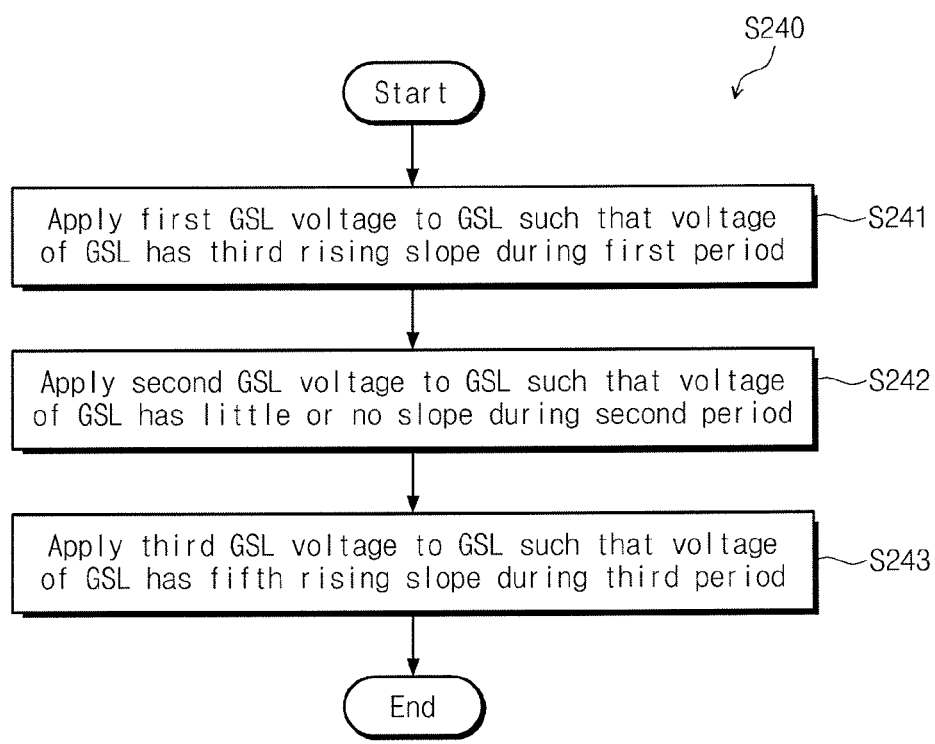
FIG. 17 is a detailed flowchart of step S240 of FIG. 13, according to an exemplary embodiment of the inventive concept.

FIG. 17 is a detailed flowchart of step S240 of FIG. 13, according to an exemplary embodiment of the inventive concept. The description of FIG. 17 is made with reference to FIGS. 2 to 4, 13, 15, and 16.

In step S241 of FIG. 17, a first ground selection line voltage Vgsl1 is applied to a ground selection line GSL during a first period P1. A voltage of the ground selection line GSL has a third rising slope dx3 due to the first ground selection line voltage Vgsl1.

In step S242 of FIG. 17, a second ground selection line voltage Vgsl2 is applied to the ground selection line GSL during a second period P2. A voltage of the ground selection line GSL has little or no slope due to the second ground selection line voltage Vgsl2. The slope during the second period P2 may be different from the third rising slope dx3. In an exemplary embodiment of the inventive concept, the slope during the second period P2 may be "0".

In step S243 of FIG. 17, a third ground selection line voltage Vgsl3 is applied to the ground selection line GSL during a third period P3. A voltage of the ground selection line GSL has a fifth rising slope dx5 due to the third ground selection line voltage Vgsl3. The fifth rising slope dx5 may be different from the third rising slope dx3 and the slope during the second period P2.

Figure 18:
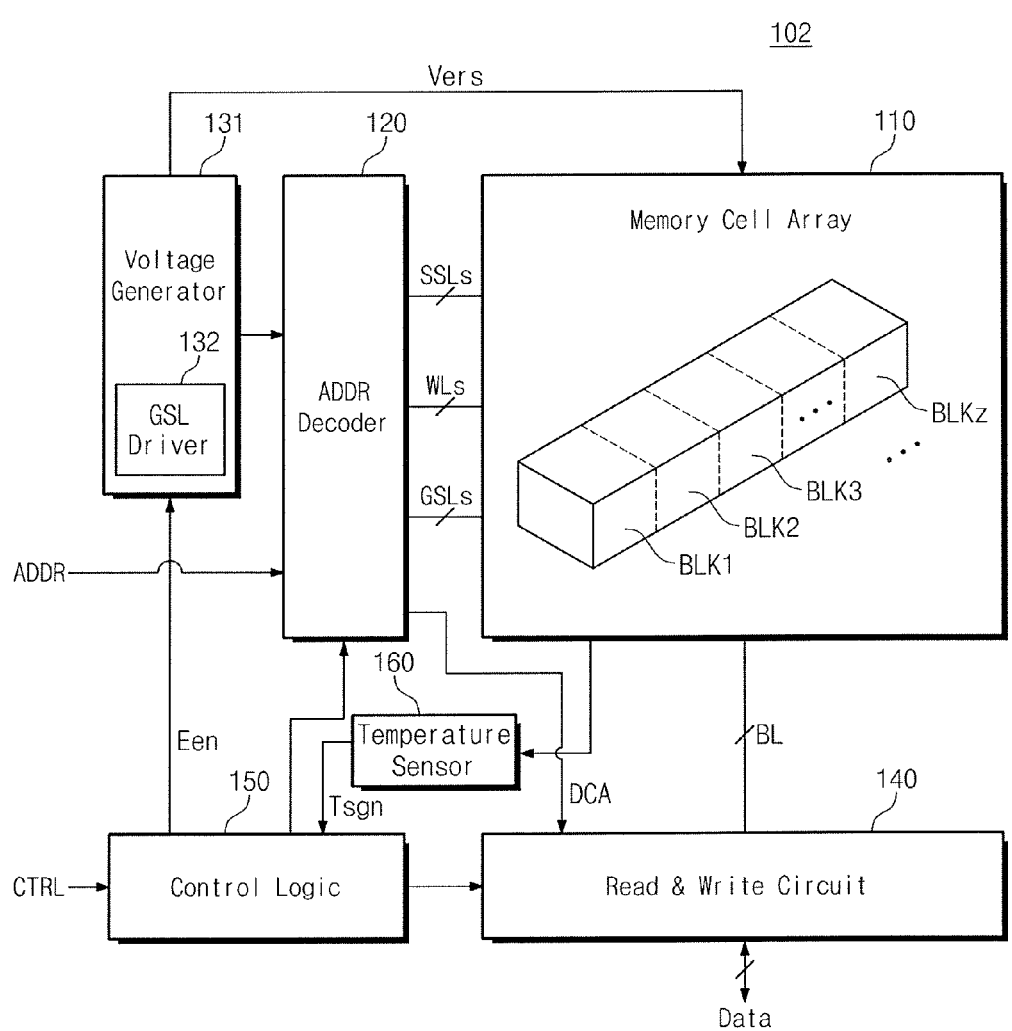
FIG. 18 is a block diagram illustrating a nonvolatile memory device according to an exemplary embodiment of the inventive concept.

FIG. 18 is a block diagram illustrating a nonvolatile memory device according to an exemplary embodiment of the inventive concept. Referring to FIG. 18, a nonvolatile memory device 102 includes a memory cell array 110, an address decoder 120, a voltage generator 131, a read/write circuit 140, a control logic 150, and a temperature sensor 160.

The components of the nonvolatile memory device 102 other than the voltage generator 131 may be substantially the same as those of FIG. 1, and thus, a detailed description thereof is omitted.

The nonvolatile memory device 102 adjusts a delay time DT according to a temperature of the memory cell array 110. In addition, the nonvolatile memory device 102 applies different ground selection line voltages to a ground selection line GSL. Thus, a rising slope of a voltage of the ground selection line GSL may be different from that of the substrate 111, under a control of the nonvolatile memory device 102.

Figure 19:
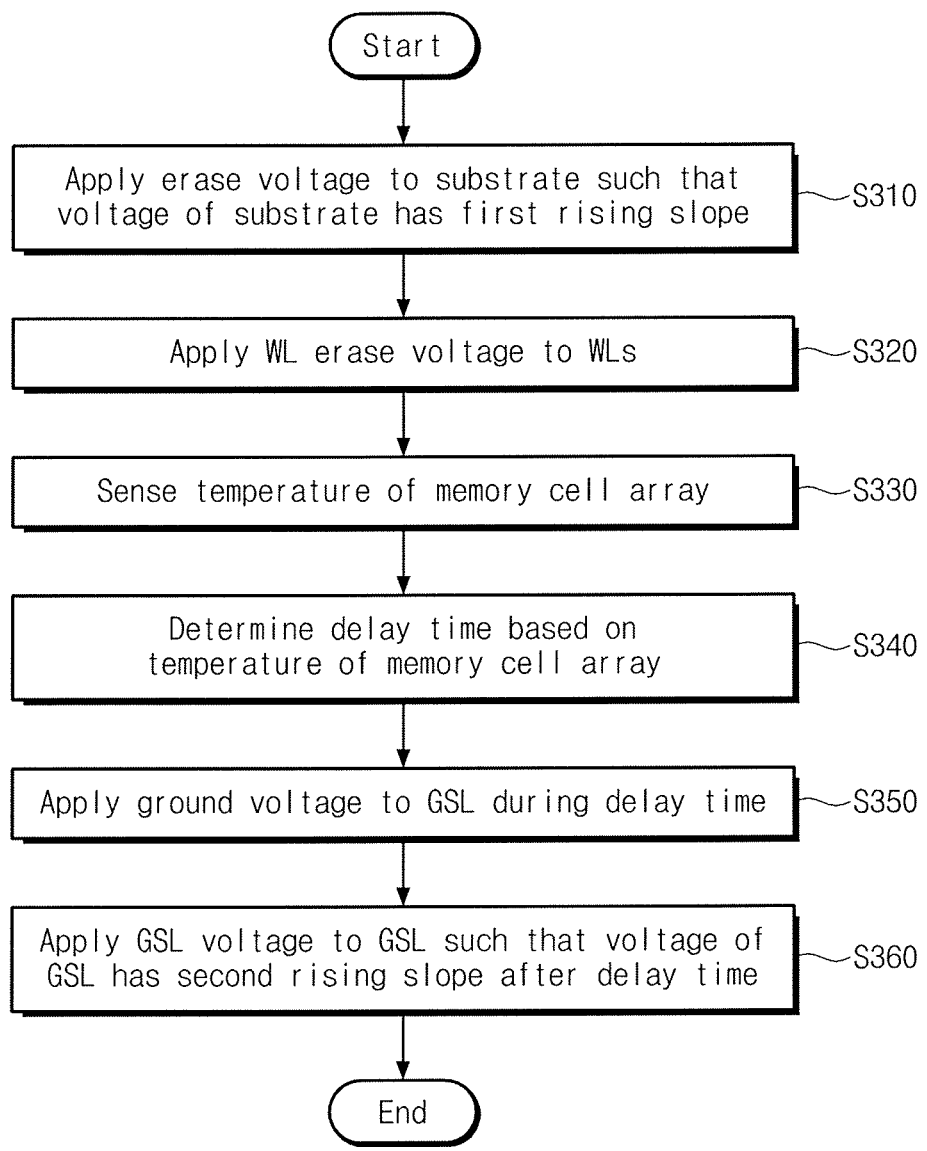
FIG. 19 is a flowchart showing an erase method of the nonvolatile memory device shown in FIG. 18, according to an exemplary embodiment of the inventive concept.

FIG. 19 is a flowchart showing an erase method of the nonvolatile memory device 102 shown in FIG. 18, according to an exemplary embodiment of the inventive concept. Referring to FIGS. 2 to 4, 11, 12, 18, and 19, in step S310, an erase voltage Vers is applied to the substrate 111. The erase voltage Vers permits a voltage of the substrate 111 to have the first rising slope dx1.

In step S320, a word line erase voltage Vwe is applied to the word lines WL1 to WL8. In step S330, the temperature sensor 160 senses a temperature of the memory cell array 110. The temperature sensor 160 provides the control logic 150 with a temperature signal Tsgn having temperature information.

In step S340, the control logic 150 sets a delay time DT based on the temperature signal Tsgn. For example, a temperature of the memory cell array 110 may be a first temperature or a second temperature. Here, the first temperature may be a temperature higher than a predetermined reference temperature, and the second temperature may be lower than the predetermined reference temperature. As described with reference to FIGS. 8 and 9, the delay time DT when the memory cell array 110 has the first temperature may be different from that when the memory cell array 110 has the second temperature.

In step S350, a ground voltage Vss is applied to the ground selection line GSL during the set delay time DT.

In step S360, a ground selection line voltage Vgsl is applied to the ground selection line GSL after the delay time DT. A voltage of the ground selection line GSL has the second rising slope dx2 due to the ground selection line voltage Vgsl. This is described with reference to FIGS. 11 and 12, and thus, a description thereof is omitted.

Figure 20:
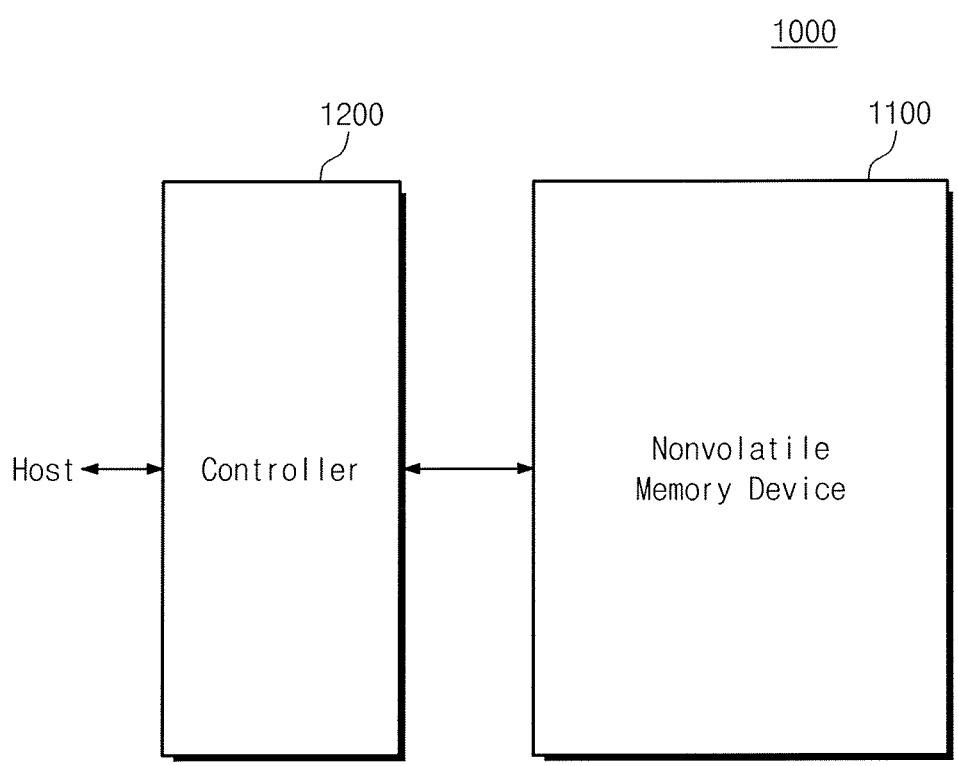
FIG. 20 is a block diagram illustrating a memory system according to an exemplary embodiment of the inventive concept.

FIG. 20 is a block diagram illustrating a memory system 1000 according to an exemplary embodiment of the inventive concept. Referring to FIG. 20, the memory system 1000 may include a nonvolatile memory device 1100 and a controller 1200.

The nonvolatile memory device 1100 may have the same structure as one of the nonvolatile memory devices 100, 101, and 102 shown in FIGS. 1, 10, and 18 and may operate the same as one of those nonvolatile memory devices. In other words, with reference to FIG. 4, the nonvolatile memory device 1100 may include a plurality of the cell strings CS11, CS12, CS21, and CS22 provided on the substrate 111. Each of the cell strings CS11, CS12, CS21, and CS22 may include a plurality of cell transistors CT stacked in a direction perpendicular to the substrate 111. The nonvolatile memory device 1100 controls voltages of the string selection lines SSL1 to SSL3 and the ground selection line GSL in response to an erase voltage Vers.

The controller 1200 is connected with a host and the nonvolatile memory device 1100. The controller 1200 accesses the nonvolatile memory device 1100 in response to a request of the host. For example, the controller 1200 controls the following operations of the nonvolatile memory device 1100: a read operation, a write operation, an erase operation, and a background operation. The controller 1200 provides an interface between the nonvolatile memory device 1100 and the host. The controller 1200 drives firmware for controlling the nonvolatile memory device 1100.

The controller 1200 may be configured to provide a control signal CTRL and an address ADDR to the nonvolatile memory device 1100. The nonvolatile memory device 1100 may be configured to perform read, program, and erase operations according to the control signal CTRL and the address ADDR provided from the controller 1200.

In an exemplary embodiment of the inventive concept, the controller 1200 may further include a random access memory (RAM), a processing unit, a host interface, and a memory interface. The RAM may be used as at least one of a working memory of the processing unit, a cache memory between the nonvolatile memory device 1100 and the host or a buffer memory between the nonvolatile memory device 1100 and the host. The processing unit may control an overall operation of the controller 1200.

The host interface may include the protocol for executing data exchange between the host and the controller 1200. For example, the host interface may communicate with an external device (e.g., the host) via at least one of various protocols such as a Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, and an Integrated Drive Electronics (IDE) protocol. The memory interface may interface with the nonvolatile memory device 1100. The memory interface may include a NAND interface or a NOR interface.

The memory system 1000 may further include an error-correcting code (ECC) block. The ECC block may be configured to detect and correct an error of data read from the nonvolatile memory device 1100 using an ECC. The ECC block may be provided as an element of the controller 1200 or as an element of the nonvolatile memory device 1100.

The controller 1200 and the nonvolatile memory device 1100 may be integrated in a single semiconductor device. The controller 1200 and the nonvolatile memory device 1100 may be integrated in a single semiconductor device to form a memory card. For example, the controller 1200 and the nonvolatile memory device 1100 may be integrated in a single semiconductor device to form a memory card such as a personal computer memory card international association (PCMCIA) card, a compact flash (CF) card, a smart media (SM) card (or, SMC), a memory stick, an MMC, a reduced size (RS)-MMC, an MMCmicro, a security card (e.g., secure digital (SD), miniSD, microSD, or SD high capacity (SDHC)), a universal flash storage (UFS) device, or the like.

The controller 1200 and the nonvolatile memory device 1100 may be integrated in a single semiconductor device to form a solid state drive (SSD). The SSD may include a storage device configured to store data in a semiconductor memory. If the memory system 1000 is used as the SSD, an operating speed of a host coupled with the memory system 1000 may be increased.

In an exemplary embodiment of the inventive concept, the memory system 1000 may be provided as a computer, a ultra-mobile personal computer (UMPC), a workstation, a net-book, a personal digital assistant (PDA), a portable computer (PC), a web tablet, a wireless phone, a mobile phone, a smart phone, a smart television, a three-dimensional television, an e-book, a portable multimedia player (PMP), a portable game console, a navigation device, a black box, a digital camera, a digital multimedia broadcasting (DMB) player, a digital audio recorder, a digital audio player, a digital picture recorder, a digital picture player, a digital video recorder, a digital video player, a device for transmitting and receiving information in a wireless environment, one of a variety of electronic devices constituting a home network, one of a variety of electronic devices constituting a computer network, one of a variety of electronic devices constituting a telematics network, a radio frequency identification (RFID) device, or one of various components constituting a computing system.

The nonvolatile memory device 1100 or the memory system 1000 may be packaged according to any of a variety of different packaging technologies. Examples of such packaging technologies may include the following: Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline Integrated Circuit (SOIC), Shrink Small Outline Package (SSOP), Thin Small Outline Package (TSOP), Thin Quad Flatpack (TQFP), System In Package (SIP), Multi Chip Package (MCP), Wafer-level Fabricated Package (WFP), and Wafer-Level Processed Stack Package (WSP).

Figure 21:
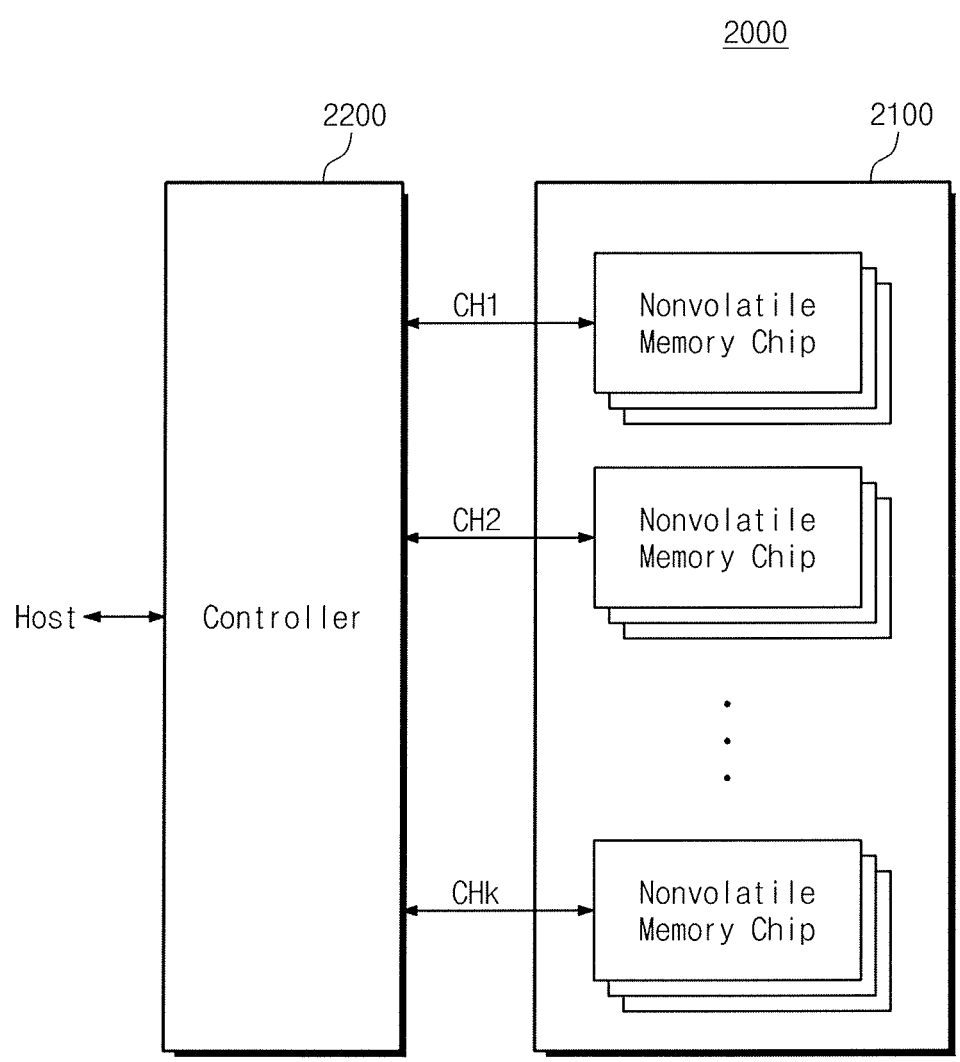
FIG. 21 is a block diagram illustrating an application of the memory system in FIG. 20, according to an exemplary embodiment of the inventive concept.

FIG. 21 is a block diagram illustrating an application of a memory system in FIG. 20, according to an exemplary embodiment of the inventive concept. Referring to FIG. 21, a memory system 2000 includes a nonvolatile memory device 2100 and a controller 2200. The nonvolatile memory device 2100 includes a plurality of nonvolatile memory chips. The plurality of nonvolatile memory chips may be classified as a plurality of groups. Nonvolatile memory chips in each group communicate with the controller 2200 via a common channel. In FIG. 21, an exemplary embodiment of the inventive concept shows a plurality of memory chips that communicate with the controller 2200 via K channels CH1 to CHk.

Each of the nonvolatile memory chips may have the same structure as one of the nonvolatile memory devices 100, 101, and 102 shown in FIGS. 1, 10, and 18 and may operate the same as one of those nonvolatile memory devices. In other words, each of the nonvolatile memory chips may include the plurality of cell strings CS11, CS12, CS21, and CS22 provided on the substrate 111. Each of the cell strings CS11, CS12, CS21, and CS22 may include a plurality of cell transistors CT stacked in a direction perpendicular to the substrate 111. Each of the nonvolatile memory chips controls voltages of the string selection lines SSL1 to SSL3 and the ground selection line GSL in response to an erase voltage Vers.

In FIG. 21, an exemplary embodiment of the inventive concept illustrates that one channel is connected with a plurality of nonvolatile memory chips. However, the memory system 2000 may be modified such that one channel is connected with one nonvolatile memory chip.

Figure 22:
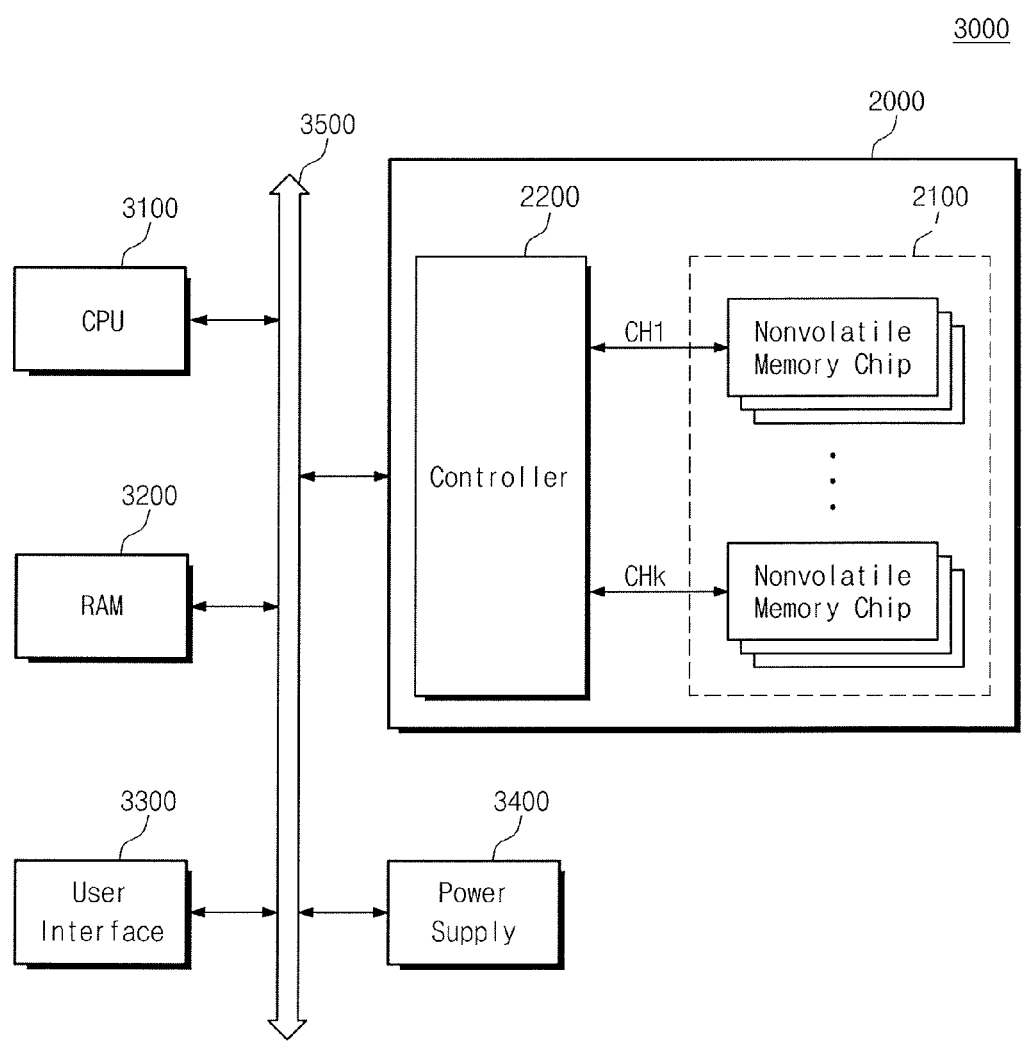
FIG. 22 is a block diagram illustrating a computing system including the memory system described in FIG. 21, according to an exemplary embodiment of the inventive concept.

FIG. 22 is a block diagram illustrating a computing system including a memory system described in FIG. 21, according to an exemplary embodiment of the inventive concept. Referring to FIG. 22, a computing system 3000 includes a central processing unit (CPU) 3100, a RAM 3200, a user interface 3300, a power supply 3400, and a memory system 2000.

The memory system 2000 may be electrically connected with the CPU 3100, the RAM 3200, the user interface 3300, and the power supply 3400. Data provided via the user interface 3300 or processed by the CPU 3100 may be stored in the memory system 2000.

In FIG. 22, an exemplary embodiment of the inventive concept illustrates a nonvolatile memory device 2100 that is connected with a system bus 3500 via a controller 2200. However, the nonvolatile memory device 2100 can be connected directly with the system bus 3500.

In FIG. 22, there is illustrated the memory system 2000 that is described with reference to FIG. 21. However, the memory system 2000 can be replaced with a variety of memory systems such as the memory system 1000 in FIG. 20.

In an exemplary embodiment of the inventive concept, the computing system 3000 may be configured to include all memory systems 1000 and 2000 described in FIGS. 20 and 21.

According to exemplary embodiments of the inventive concept, holes are smoothly supplied from a substrate to a vertical active pattern by applying a ground voltage to a ground selection line during a delay time, to help prevent an erase fail.

According to exemplary embodiments of the inventive concept, an erase fail that occurs when a threshold voltage variation of a ground selection transistor changes according to a temperature, may be prevented. In addition, an erase fail that occurs when an erase voltage increment $\Delta$Vers changes according to a temperature, may be prevented.

According to exemplary embodiments of the inventive concept, a voltage difference between a voltage of a ground selection line and a voltage of a substrate is reduced by increasing a voltage of the ground selection line faster than a voltage of the substrate. This way, a ground selection transistor may be prevented from being erased when erasing a memory cell array. Thus, a reliable erase operation may be obtained by minimizing a threshold voltage variation of the ground selection transistor.

While the inventive concept has been described with reference to exemplary embodiments thereof, it will be apparent to those skilled in the art that various changes and modifications may be made thereto without departing from the scope of the inventive concept as defined by the following claims.

What is claimed is:

1. An erase method of a nonvolatile memory device which includes a memory cell array having a plurality of memory cells stacked in a direction substantially perpendicular to a substrate and a ground selection transistor connected to the plurality of memory cells, the erase method comprising:
   applying an erase voltage to the substrate;
   sensing a temperature of the memory cell array;
   setting a delay time based on the temperature of the memory cell array, wherein the delay time starts when the erase voltage start to be applied to the substrate;
   applying a ground voltage to a ground selection line connected to the ground selection transistor during the delay time; and
   increasing a voltage of the ground selection line after the delay time.

2. The erase method of claim 1, wherein in the setting of the delay time, the delay time is increased as the temperature of the memory cell array increases.

3. The erase method of claim 1, wherein in the setting of the delay time, the delay time is set so that an erase voltage increment when the memory cell array has a first temperature is substantially the same as an erase voltage increment when the memory cell array has a second temperature lower than the first temperature.

4. The erase method of claim 1, wherein in the setting of the delay time, the delay time is set so that a threshold voltage variation of the ground selection transistor when the memory cell array has a first temperature is substantially the same as a threshold voltage variation of the ground selection transistor when the memory cell array has a second temperature lower than the first temperature.

5. The erase method of claim 1, wherein in the increasing of the voltage of the ground selection line, the ground selection line is floated after the delay time.

6. The erase method of claim 1, wherein the increasing of the voltage of the ground selection line comprises:
   applying a ground selection line voltage to the ground selection line after the delay time.

7. The erase method of claim 6, wherein a voltage of the substrate increases along a first rising slope from a time when the erase voltage is applied to a maintaining time and the substrate maintains the erase voltage after the maintaining time, and
   wherein a voltage of the ground selection line increases along a second rising slope different from the first rising slope from an end of the delay time to the maintaining time and the ground selection line maintains the ground selection line voltage after the maintaining time.

8. The erase method of claim 7, wherein the second rising slope is greater than the first rising slope.

9. The erase method of claim 7, wherein a voltage difference between a voltage of the ground selection line and a voltage of the substrate at the end of the delay time is greater than a voltage difference between a voltage of the ground selection line and a voltage of the substrate at the maintaining time.

10. The erase method of claim 7, wherein the increasing of the voltage of the ground selection line further comprises:
    floating the ground selection line after the maintaining time.

11. The erase method of claim 6, wherein the applying of the ground selection line voltage comprises:
    applying a first ground selection line voltage to the ground selection line during a first period after the delay time; and
    applying a second ground selection line voltage to the ground selection line during a second period following the first period.

12. The erase method of claim 11, wherein a voltage of the ground selection line has a third rising slope during the first period and has a constant level during the second period.

13. The erase method of claim 12, wherein the applying of the ground selection line voltage comprises:
    applying a third ground selection line voltage to the ground selection line during a third period following the second period.

14. The erase method of claim 13, wherein a voltage of the ground selection line has a fifth rising slope different from the third rising slope.

15. An erase method of a nonvolatile memory device which includes a memory cell array having a plurality of memory cells stacked in a direction substantially perpendicular to a substrate and a ground selection transistor connected to the plurality of memory cells, the erase method comprising:
    applying an erase voltage to the substrate so that a voltage of the substrate has a first rising slope;
    applying a ground voltage to a ground selection line connected with the ground selection transistor, wherein the ground voltage is applied to the ground selection line in response to the application of the erase voltage; and
    applying a ground selection line voltage to the ground selection line so that a voltage of the ground selection line has a second rising slope greater than the first rising slope.

16. The erase method of claim 15, wherein the ground selection line voltage is different from the erase voltage.

17. The erase method of claim 15, wherein a voltage of the substrate increases along the first rising slope from when the erase voltage is applied to a maintaining time and the substrate maintains the erase voltage after the maintaining time, and
    wherein a voltage of the ground selection line increases along the second rising slope different from the first rising slope from an end of the delay time to the maintaining time and the ground selection line maintains the ground selection line voltage after the maintaining time.

18. The erase method of claim 17, wherein a voltage difference between a voltage of the ground selection line and a voltage of the substrate at the end of the delay time is greater than a voltage difference between a voltage of the ground selection line and a voltage of the substrate at the maintaining time.

19. A nonvolatile memory device, comprising:
    a memory cell array including a plurality of memory cells stacked in a direction substantially perpendicular to a substrate and a ground selection transistor connected to the plurality of memory cells;
    an address decoder connected with the plurality of memory cells via word lines and with the ground selection transistor via a ground selection line;
    a read/write circuit connected with the memory cell array via bit lines;
    a voltage generator configured to generate an erase voltage to be applied to the substrate and a ground voltage to be applied to the ground selection line, at an erase operation;

a temperature sensor configured to sense a temperature of the memory cell array; and a control logic configured to set a delay time according to the sensed temperature and control a voltage of the ground selection line to rise after the delay time, wherein the delay time starts when the erase voltage is initially applied to the substrate.

20. The nonvolatile memory device of claim 19, wherein the control logic is further configured to increase the delay time as the sensed temperature of the memory cell array increases.

* * * * *